(12) United States Patent
Gardner et al.

(10) Patent No.: US 6,388,298 B1
(45) Date of Patent: May 14, 2002

(54) DETACHED DRAIN MOSFET

(75) Inventors: Mark I. Gardner, Cedar Creek; H. Jim Fulford, Jr., Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/207,651

(22) Filed: Dec. 8, 1998

Related U.S. Application Data

(62) Division of application No. 08/759,859, filed on Dec. 3, 1996, now Pat. No. 5,926,714.

(51) Int. Cl.$^7$ .............................................. H01L 29/76
(52) U.S. Cl. ..................... 257/408; 257/336; 257/344; 257/408; 257/409; 257/549; 257/550; 438/270; 438/271
(58) Field of Search ................................ 257/336, 344, 257/408, 409, 549, 550; 438/270, 271

(56) References Cited

U.S. PATENT DOCUMENTS

| 4,222,062 A | 9/1980 | Trotter et al. |
| 4,818,714 A | 4/1989 | Haskell |

(List continued on next page.)

OTHER PUBLICATIONS

Streetman, Ben G., *Solid State Electronic Devices*, Second Edition, 1980 by Prentice–Hall, Inc., pp. 319–321.
Wolf, Stanley Silicon Processing For The VLSI Era, vol. 1: Process Technology, Lattice Press pp. 2380–300, 1986.
Streetman, Ben G., *Solid State Electronic Devices*, Fourth Edition, 1995 by Prentice–Hall, Inc., pp. 319–321.

*Primary Examiner*—Eddie Lee
*Assistant Examiner*—Edgardo Ortiz
(74) *Attorney, Agent, or Firm*—Conley, Rose & Tayon, PC; Robert C. Kowert

(57) ABSTRACT

A detached drain transistor including a semiconductor substrate, a source impurity distribution, a drain impurity distribution, a gate dielectric, and a conductive gate. The source impurity distribution is substantially contained within a source region of the semiconductor substrate. The drain impurity distribution is substantially contained within a detached drain region of the semiconductor substrate. The gate dielectric is formed on an upper surface of the semiconductor substrate. The conductive gate is formed on the gate dielectric and laterally disposed over a channel region of the semiconductor substrate. The channel region extends laterally between the source region of the semiconductor substrate and the detached drain region. The channel boundary of the detached drain region is laterally displaced from a first sidewall of the conductive gate by a detached displacement. Preferably, the gate dielectric is a thermal oxide having a thickness of approximately 20 to 200 angstroms. The conductive gate preferably comprises polysilicon having a sheet resistivity of less than approximately 500 Ω/square. Alternatively, the conductive gate may comprise a metal of aluminum, copper, tungsten or alloys thereof. The lateral dimension of the conductive gate is ideally less than approximately 0.3 microns, while the drain displacement, in this embodiment, is approximately 500 to 1500 angstroms.

22 Claims, 6 Drawing Sheets

U.S. PATENT DOCUMENTS

| | | | |
|---|---|---|---|
| 4,835,112 A | 5/1989 | Pfiester et al. | |
| 4,843,023 A | 6/1989 | Chiu et al. | |
| 4,951,100 A | 8/1990 | Parillo | |
| 4,994,869 A | 2/1991 | Matloubian et al. | |
| 5,286,664 A | 2/1994 | Horiuchi | |
| 5,341,003 A | 8/1994 | Obinata | |
| 5,369,297 A | 11/1994 | Kusunoki et al. | |
| 5,432,106 A | 7/1995 | Hong | |
| 5,480,814 A | 1/1996 | Wuu et al. | |
| 5,482,880 A | 1/1996 | Kaya et al. | |
| 5,510,279 A | 4/1996 | Chien et al. | |
| 5,510,284 A | 4/1996 | Yamauchi | |
| 5,516,707 A | 5/1996 | Loh et al. | |
| 5,547,885 A | 8/1996 | Ogoh | |
| 5,565,369 A | 10/1996 | Ko | |
| 5,576,556 A | 11/1996 | Takemura et al. | |
| 5,580,804 A | 12/1996 | Joh | |
| 5,583,067 A | 12/1996 | Sanchez | |
| 5,607,869 A | 3/1997 | Yamazaki | |
| 5,629,220 A | 5/1997 | Yang | |
| 5,654,215 A | 8/1997 | Gardner et al. | |
| 5,656,518 A | 8/1997 | Gardner et al. | |
| 5,696,019 A | 12/1997 | Chang | |
| 5,705,439 A | 1/1998 | Chang | |
| 5,741,736 A | 4/1998 | Orlowski et al. | |
| 5,747,852 A * | 5/1998 | Chang et al. | 257/336 |
| 5,759,897 A * | 6/1998 | Kadosh et al. | 438/286 |
| 5,789,780 A | 8/1998 | Fulford, Jr. et al. | |
| 5,874,343 A | 2/1999 | Fulford, Jr. et al. | |
| 5,885,879 A | 3/1999 | Gardner et al. | |
| 5,900,666 A | 5/1999 | Gardner et al. | |
| 5,923,983 A | 7/1999 | Fulford, Jr. et al. | |
| 5,926,714 A | 7/1999 | Gardner et al. | |
| 5,937,303 A | 8/1999 | Gardner et al. | |
| 6,020,232 A | 2/2000 | Gardner et al. | |
| 6,057,576 A * | 5/2000 | Hsia et al. | 257/344 |
| 6,078,082 A * | 6/2000 | Bulucea | 257/345 |
| 6,078,086 A * | 6/2000 | Park | 257/386 |
| 6,121,099 A | 9/2000 | Fulford, Jr. et al. | |
| 6,147,383 A * | 11/2000 | Kuroda | 257/344 |
| 6,150,695 A * | 11/2000 | Gardner et al. | 257/347 |
| 6,184,566 B1 * | 2/2001 | Gardner et al. | 257/510 |
| 6,215,156 B1 * | 4/2001 | Yang | 257/360 |

* cited by examiner

DETACHED DRAIN MOSFET

This application is a Divisional of U.S. Ser. No. 08/759,859 filed on Dec. 3, 1996 now U.S. Pat. No. 5,926,714.

BACKGROUND OF THE INVENTION

1. Field of the Invention

This invention relates to the field of semiconductor processing and MOS transistors and, more particularly, to a structure and method in which source/drain regions within the semiconductor substrate are detached or laterally displaced from the transistor gate.

2. Description of the Relevant Art

The operating characteristics of transistors fabricated with metal-oxide-semiconductor (MOS) integrated circuit techniques are a function of the transistor's dimensions. In particular, the source-to-drain current ($I_{ds}$) is proportional to the ratio of the transistor's width (W) to the transistor's length (L). For given a transistor width and a given biasing condition (e.g., $V_G$=3V, $V_D$=3V, and $V_s$=0V), $I_{ds}$ is maximized by minimizing the transistor length L. Minimizing transistor channel length also improves the speed of integrated circuits comprised of a large number of individual transistors because the larger drain current associated with a short channel length can drive the adjoining transistors into saturation more quickly. Minimizing L is, therefore, desirable from an device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and with it, a corresponding increase in the circuit complexity that can be achieved on the given area of silicon.

The benefits achieved by minimizing the channel length L are accompanied by an increased sensitivity to voltage breakdown. As device channel lengths drop below 0.5 microns, the stability and reliability of the transistor must be carefully monitored. One widely recognized and easily tested parameter is the drain voltage breakdown (commonly referred to as BVDSS). BVDSS can be measured by grounding the gate, source, and substrate of a test transistor and ramping the drain voltage from 0 volts while measuring the drain voltage at which a drain current of approximately 1µA begins to conduct. BVDSS, therefore, indicates a drain voltage at which the device conducts current whether or not a bias is applied to the transistor gate. Because unwanted drain currents increase the power requirements of the integrated circuit and the temperature of the integrated circuit, and can result in an inadvertent activation of other transistors within the circuit, the maximization of BVDSS is critical, especially in short channel devices. In conventional MOS transistors, BVDSS begins to approach the operating voltage of the transistor as the channel length falls below approximately 0.5 microns. FIG. 1 shows a transistor 10 which is comprised of a substrate 12, a gate dielectric 14, a gate electrode 16, and a pair of source/drain regions 20a and 20b. Transistor 10 is fabricated such that channel boundaries 22a and 22b of source/drain regions 20a and 20b are in close proximity to lateral positions of first and second sidewalls 18a and 18b of gate electrode 16. Source/drain regions 20a and 20b are typically heavily doped with an impurity to provide a plentiful source of mobile carriers for conduction after an inversion region is created in the substrate 12 under gate electrode 16. The use of heavily doped source/drain regions that have a channel boundary coincident with sidewalls of the transistor gate results in a transistor having an undesirably low drain breakdown voltage BVDSS. BVDSS decreases with channel length L partly because the maximum electric field within channel region 21 of transistor 10 increases. This increased electric field can provide sufficient energy to mobile carriers within drain region 20b to overcome the reversed biased junction between drain region 20b and channel region 21 thereby increasing the drain current.

One well known approach to reduce the short channel effects described in the preceding paragraph includes the fabrication of lightly doped drain (LDD) structures. FIG. 2 shows a typical transistor 30 incorporating LDD regions 40a and 40b. Transistor 30 includes a semiconductor substrate 32, a gate dielectric 34, a gate electrode 36, lightly doped regions 40a and 40b, and heavily doped regions 48a and 48b. Transistor 30 also includes spacer structures 44a and 44b that facilitate the lateral displacement of the heavily doped regions 48a and 48b from sidewalls 38a and 38b of gate electrode 36. Typically, the peak impurity concentration within lightly doped drain regions 40a and 40b is less than the peak impurity concentration within heavily doped regions 48a and 48b. Channel boundaries 42a and 42b of lightly doped regions 40a and 40b are approximately aligned with lateral positions of first sidewall 38a and second sidewall 38b of gate electrode 36. Interior boundaries 49a and 49b of heavily doped regions 48a and 48b are laterally displaced from sidewalls 38a and 38b of gate electrode 36. Because lightly doped regions 40a and 40b are typically doped with a lighter impurity concentration than heavily doped regions 48a and 48b, the resistivity of lightly doped regions 40a and 40b is higher than a resistivity of heavily doped regions. Accordingly, an applied drain voltage is distributed across lightly doped drain region 40b and results in reduced electric field within channel region 41 that results in an increased BVDSS of transistor 30. It will be appreciated that in the case of both transistor 10 of FIG. 1 and transistor 30 of FIG. 2, the channel boundaries of the source/drain impurity distributions are approximately coincident with sidewalls of the gate electrode. This alignment of the source/drain boundaries and the gate electrode sidewalls has generally been considered desirable. Significant overlap between the gate electrode and the source/drain regions is avoided because of the increased parasitic capacitance that results when a source/drain region extends significantly below the gate electrode. Because the transistor drain typically functions as the device output and the gate electrode typically functions as the device input, any parasitic capacitance between drain and gate produces an undesirable feedback mechanism that limits the high frequency operation of the device. See, e.g., Ben G. Streetman, *Solid State Electronic Devices* 319–321(Prentice-Hall 1980). Therefore, conventional transistors have generally been fabricated in a manner designed to minimize overlap between the source/drain regions and the gate electrode, most notably through the use of the self aligned silicon gate technology. Despite the desire to minimize parasitic capacitance due to excessive overlap, conventional transistor design typically required some lateral overlap between the source/drain regions and the gate electrode. The overlap was generally considered necessary to form a complete channel from source to drain region and it was believed that a non-functional device could result if the gate did not extend to the source and drain impurity distributions. Id.

The requirement that the gate electrode extend to the source and drain impurity distributions results in an undesirably low BVDSS when the channel length of the transistor drops below 0.5 microns. This undesirable result can only be partially offset by implementation of the LDD structures described with respect to FIG. 2. The presence of lightly doped drain structures does not fully restore the BVDSS of the transistor to a desired range. (It is generally considered desirable to have BVDSS at least 1.5 to 3 times greater than the normal operating voltage of the particular technology). As discussed previously, short channel devices are desirable because of the larger number of such devices that can be fabricated within a given area. Therefore, it is highly desirable to design and fabricate a semiconductor structure and process resulting in transistors having increased tolerance to BVDSS for channel lengths well below 0.5 microns.

SUMMARY OF THE INVENTION

The problems identified above are in large part addressed by transistors and integrated circuits fabricated according to a semiconductor manufacturing process in which the drain region is laterally displaced from a sidewall of the conductive gate. In alternative embodiments, the source region may also be displaced from the lateral position of the conductive gate. Displacing the drain region and, in some cases the source region, increases the transistor's tolerance to BVDSS and permits the fabrication of deep submicron channel transistor, exhibiting uncharacteristically high breakdown voltages. Specific embodiments may take on a variety of forms as discussed in greater detail below. In addition, these detached drain transistors may be integrated into a conventional transistor fabrication process to produce devices and integrated circuits including both detached drain and more conventional transistors. In this manner, desired devices may be selectively fabricated to exhibit a higher BVDSS while the remaining transistors are fabricated according to a more conventional design and process flow.

Broadly speaking, the present invention, in a first implementation, comprises a detached drain transistor. The detached drain transistor includes a semiconductor substrate, a source impurity distribution, a drain impurity distribution, a gate dielectric, and a conductive gate. The source impurity distribution is substantially contained within a source region of the semiconductor substrate. The drain impurity distribution is substantially contained within a detached drain region of the semiconductor substrate. The gate dielectric is formed on an upper surface of the semiconductor substrate. The conductive gate is formed on the gate dielectric and laterally disposed over a channel region of the semiconductor substrate. The channel region extends laterally between the source region of the semiconductor substrate and the detached drain region. The channel boundary of the detached drain region is laterally displaced from a first sidewall of the conductive gate by a detached displacement.

Preferably, the semiconductor substrate comprises single crystal silicon having a resistivity of approximately 10 to 15Ω-cm. In one embodiment, the source region includes a lightly doped source region and a heavily doped source region. The lightly doped source region extends to a first depth below the upper surface of the semiconductor substrate and is laterally displaced within the substrate such that a channel boundary of the lightly doped source region is approximately coincident with a lateral position of a second sidewall of a conductive gate. The heavily doped source region extends to a second depth below the upper surface of the substrate. The second depth is greater than the first depth and the heavily doped source region is laterally displaced within the semiconductor substrate such that an interior boundary of the heavily doped source region is displaced from the second sidewall of the conductive gate by a source displacement. In this embodiment, the source impurity distribution includes a first source impurity distribution substantially contained within the lightly doped source region and a second source impurity distribution substantially contained within the heavily doped source region. A peak concentration of the second source impurity distribution is preferably greater than a peak concentration of the first impurity distribution. Preferably, a peak concentration of the drain impurity distribution is approximately equal to a peak concentration of the second source impurity distribution and the drain displacement is approximately equal to the source displacement.

Preferably, the gate dielectric is a thermal oxide having a thickness of approximately 20 to 200 angstroms. The conductive gate preferably comprises polysilicon having a sheet resistivity of less than approximately 500Ω/square. Alternatively, the conductive gate may comprise a metal of aluminum, copper, tungsten or alloys thereof. The lateral dimension of the conductive gate is ideally less than approximately 0.3 microns, while the drain displacement, in this embodiment, is approximately 500 to 1500 angstroms.

The present invention still further contemplates a semiconductor manufacturing process. The process includes the steps of providing a semiconductor substrate, forming a gate dielectric on an upper surface of the semiconductor substrate, forming a conductive gate on the gate dielectric, introducing a source impurity distribution into a source region of the semiconductor substrate, and introducing a drain impurity distribution into a detached drain region. The semiconductor substrate includes a channel region that is laterally disposed between the source region and the detached drain region of the semiconductor substrate. The conductive gate is formed such that a first sidewall of the conductive gate is laterally displaced a drain displacement from a channel boundary of the detached drain region and further such that a lateral position of a second sidewall of the conductive gate is approximately coincident with a lateral position of a channel boundary of the source region of the semiconductor substrate. The drain impurity distribution is introduced into the detached drain region of the semiconductor substrate whereby the drain impurity distribution is laterally displaced from the first sidewall of the conductive gate by the drain displacement.

The step of forming the gate dielectric preferably comprises thermally oxidizing the upper surface of the semiconductor substrate at a temp of greater than approximately 800° C. to form a thermal oxide of approximately 20 to 200 angstroms in thickness. The conductive gate may be formed by depositing a conductive film on the gate dielectric and patterning the conductive film with a photolithography masking step. In one embodiment, the deposition of the conductive film comprises chemically vapor depositing polysilicon and introducing a gate impurity distribution into the polysilicon to reduce the sheet resistivity of the polysilicon to less than approximately 500Ω/square. In an alternative embodiment, the step of depositing the conductive film comprises sputter depositing a metal selected from a group consisting of aluminum, copper, tungsten, and alloys thereof. The source region, in one embodiment, includes a lightly doped source region and a heavily doped source region. In this embodiment, the step of introducing the source impurity distribution into the source region comprises ion implanting a first source impurity distribution into the semiconductor substrate, forming a spacer structure on the second sidewall of the conductive gate, and ion implanting a second source impurity distribution into the semiconductor substrate. In this embodiment, the first source impurity distribution is ion implanted into the lightly doped impurity region of the semiconductor substrate such that the lightly doped impurity region substantially contains the first source impurity distribution. The lightly doped impurity region extends to a first depth below the upper surface of the semiconductor substrate. The spacer structure is formed on the second sidewall of the conductive gate such that the spacer structure protects a portion of the source region proximal to the second sidewall. The second source impurity distribution is implanted into the semiconductor substrate such that the heavily doped impurity region substantially contains the second source impurity distribution and wherein the heavily doped impurity region extends to a second depth below the upper surface of the semiconductor substrate. The first depth is less than the second depth and a peak concentration of the first source impurity distribution is less than a peak concentration of the second source impurity distribution. Preferably, the step of introducing a drain impurity distribution includes forming a spacer structure on the first sidewall of the conductive gate. Ideally, the lateral dimension of the spacer structure is approximately equal to the drain displacement such that the first spacer structure protects a portion of the channel region laterally displaced between the channel boundary of the detached drain region and a lateral position of the first sidewall of the conductive gate. The drain displacement is preferably less than approximately 0.15 microns. Preferably, the steps of introducing the impurity distributions into the semiconductor substrate is comprised implanting ions of arsenic, boron or phosphorous into the semiconductor substrate. In one such embodiment, an implant dose for the step of introducing the drain impurity distribution is in the range of approximately $2\times10^{12}$ to $5\times10^{15}$ atoms/cm$^2$.

In a second implementation, the present invention still further contemplates an alternative embodiment of the detached drain transistor comprising a semiconductor substrate, a gate dielectric, and a first and a second source/drain impurity distribution. The substrate includes a channel region laterally displaced between a first and a second source/drain region. The gate dielectric is formed on an upper surface of the semiconductor substrate. The conductive gate is formed on the gate dielectric and includes a first and a second sidewall. The first and second sidewalls of the conductive gate are laterally displaced from channel boundaries of the first and second source/drain regions by a source/drain displacement. The first and second source/drain impurity distributions are substantially contained within the first and second source/drain regions respectively of the semiconductor substrate. Preferably, the transistor further includes a gate insulator formed in contact with the first and second sidewalls of the semiconductor substrate. Respective exterior sidewalls of the gate insulator are laterally displaced from the first and second sidewalls by a first displacement. In one embodiment, the gate insulator includes an inner insulator comprising a first dielectric material and an outer insulator comprising a second insulator material. In one such embodiment, the inner insulator comprises oxide and the outer insulator comprises silicon nitride. In one embodiment, a thickness of the inner insulator is approximately 50 to 100 angstroms and a thickness of the outer insulator is less than or equal to approximately 200 angstroms. The gate dielectric typically comprises an oxide having a thickness of approximately 20 to 200 angstroms while the conductive gate may comprise polysilicon having a sheet resistivity of less than approximately 500Ω/square or, alternatively, the conductive gate may comprise aluminum, copper, tungsten or alloys thereof. A lateral dimension of the conductive gate is preferably less than 0.3 microns and the breakdown voltage of the transistor is greater than approximately 7 volts. Preferably, the first and second source/drain impurity distributions comprise ions of arsenic, phosphorous or boron and a peak concentration of the first and second source/drain impurity distributions is preferably greater than $1\times10^{19}$ atoms/cm$^3$. In one embodiment, the source/drain displacement is approximately 200 to 300 angstroms.

Embodiments of the present invention still further contemplate an integrated circuit. The integrated circuit comprises a semiconductor substrate that includes a first transistor region and second transistor region laterally displaced from the first transistor region. The integrated circuit further includes a first transistor formed over the first transistor region and second transistor formed over the second transistor region. The first transistor is formed according to the transistor of the previous paragraph. The second transistor includes a second conductive gate, a pair of lightly doped impurity distributions, and a pair of heavily doped impurity distributions. The pair of lightly doped impurity distributions are substantially contained within a pair of lightly doped impurity regions laterally displaced on either side of a channel region of the second transistor region. The channel boundaries of the lightly doped regions are approximately coincident with lateral positions of the first and second sidewalls of the second conductive gate. A peak concentration of the lightly doped impurity distributions is less than approximately $5\times10^{17}$ atoms/cm$^3$. The pair of heavily doped impurity distributions are substantially contained within a pair of heavily doped impurity regions laterally displaced on either side of the channel region of the second transistor. Interior boundaries of the heavily doped regions are laterally displaced from the first and second sidewalls of the second conductive gate by approximately the source/drain displacement of the first transistor. A peak concentration of the heavily doped impurity distributions is greater than approximately $1\times10^{19}$ atoms/cm$^3$.

The present invention still further contemplates a second implementation of a semiconductor process. The process includes providing a semiconductor substrate, forming a gate dielectric on the semiconductor substrate, forming a conductive gate, and introducing first and second impurity distributions into the semiconductor substrate. The semiconductor substrate includes a channel region laterally displaced between a first and second source/drain region. The conductive gate is formed on an upper surface of the gate dielectric such that first and second sidewalls of the conductive gate are laterally displaced from respective channel boundaries of the first and second source/drain regions by a source/drain displacement such that a displacement between the channel boundaries is greater than a lateral dimension of the conductive gate. Thereafter, first and second impurity distributions are introduced into the semiconductor substrate such that the first and second source/drain regions substantially contain the respective impurity distributions. Preferably the step of forming the gate dielectric comprises thermally oxidizing the upper surface of semiconductor substrate at a temperature greater than approximately 800° C. for a duration sufficient such that a thickness of the gate dielectric is approximately 20 to 200 angstroms. In one embodiment, the process further comprises prior to the step of introducing the first and second impurity distributions, thermally oxidizing the conductive gate to form an inner gate insulator in contact with the first and second sidewalls of the conductive gate and wherein the thickness of the inner gate insulator is approximately 50 to 100 angstroms. Subsequently, a second gate insulator is preferably formed on the exterior sidewalls of the inner gate insulator. A preferred thickness of the second gate insulator is approximately 150 to 250 angstroms. Ideally, the second gate insulator is formed by depositing silicon nitride upon the topography defined by the first gate insulator and the upper surface of the semiconductor substrate and anisotropically etching the silicon nitride layer to remove portions of the silicon nitride substantially parallel to the upper surface of the semiconductor substrate whereby the second gate insulator comprises spacer structures in contact with exterior sidewalls of the inner gate insulator.

In a third implementation, the present invention still further contemplates an integrated circuit comprising a semiconductor substrate, a gate dielectric formed on an upper surface of the semiconductor substrate, a first and a second conductive gate formed on the gate dielectric, a lightly doped impurity distribution, and a first source impurity distribution, and a detached impurity distribution. The first and second conductive gates are formed on the gate dielectric such that the first conductive gate is displaced over a first transistor region of the semiconductor substrate and the second transistor gate is displaced over a second transistor region of the semiconductor substrate. The lightly doped impurity distribution is introduced into the second transistor region such that it is substantially contained within first and second lightly doped impurity regions laterally displaced on either side of a channel region of the second transistor region. A lateral dimension of the channel region of the second transistor region is approximately equal to a lateral dimension of the second conductive gate such that channel boundaries of the first and second lightly doped impurity regions are approximately coincident with lateral positions of the first and second sidewalls of the second conductive gate. The first source impurity distribution is substantially contained within a first source region of the first transistor region. The first source region is laterally displaced from a channel region of the first transistor region. A channel boundary of the first source region is approximately coincident with a lateral position of the second sidewall of the first conductive gate. The detached impurity distribution is substantially contained within first and second pairs of detached source/drain regions. Respective pairs of the detached source/drain regions are laterally displaced on either side of channel regions within corresponding transistor regions. Interior boundaries of the detached source/drain regions are laterally displaced a source/drain displacement from respective sidewalls of the conductive gate. Preferably, the integrated circuit further includes a first and a second pair of spacer structures formed in contact with sidewalls of the first and second conductive gates respectively. A lateral dimension of the spacer structures is approximately equal to the source/drain displacement. In one embodiment, a lateral dimension of the spacer structure is approximately 500 to 1000 angstroms. Preferably, the first conductive gate has a lateral dimension less than approximately 0.3 microns. In alternative embodiments, the first and second conductive gates may comprise polysilicon having a sheet resistivity less than approximately 500Ω/square or the conductive gates may comprise a metal such as aluminum, copper, tungsten or alloys thereof.

The present invention still further contemplates a third implementation of an integrated circuit process comprising providing a semiconductor substrate, forming a gate dielectric on an upper surface of the semiconductor substrate, forming first and second conductive gates on the gate dielectric, introducing a lightly doped impurity distribution into the substrate, introducing a first source impurity distribution into the substrate, and introducing a detached impurity distribution into the semiconductor substrate. The first and second conductive gates are formed on the gate dielectric such that the first conductive gate is displaced over a first transistor region of the semiconductor substrate and the second transistor gate is displaced over a second transistor region of the semiconductor substrate, the first transistor region being laterally displaced from the second transistor region. The lightly doped impurity distribution is introduced into the second transistor region of the semiconductor substrate such that the lightly doped impurity distribution is substantially contained within first and second lightly doped impurity regions laterally displaced on either side of a channel region of the second transistor region. A lateral dimension of the channel region of the second transistor region is approximately equal to a lateral dimension of the second conductive gate. The first source impurity distribution is introduced into the semiconductor substrate such that it is substantially contained within a first source region of the first transistor region. The first source region is laterally displaced from a channel region of the. first transistor region such that a channel boundary of the first source region is approximately coincident with a second sidewall of the first conductive gate. The detached impurity distribution is introduced into the semiconductor substrate such that it is substantially contained within first and second pairs of detached source/drain regions. Respective pairs of the detached source/drain regions are laterally displaced on either side of channel regions within corresponding transistor regions of the semiconductor substrate. Interior boundaries of the detached source/drain regions are laterally displaced from respective sidewalls of respective conductive gates by a source/drain displacement.

Preferably, the step of introducing the lightly doped impurity distribution includes implanting ions of arsenic, boron, or phosphorous at an implant energy less than approximately 20 keV and at a dose of less than approximately $5 \times 10^{14}$ atoms/cm$^2$. The step of introducing the first source impurity distribution comprises implanting ions of arsenic, boron, or phosphorous at an implant dose in the approximate range of $2 \times 10^{12}$ to $1 \times 10^{15}$ atoms/cm$^2$. The step of introducing the detached impurity distribution includes implanting ions of arsenic, boron or phosphorous using an implant dose greater than approximately $5 \times 10^{14}$ atoms/cm$^2$. In one embodiment, the process further includes, prior to introducing the detached impurity distribution, forming a first pair and a second pair of spacer structures on sidewalls of the first and second conductive gates respectively. A lateral dimension of the spacer structures is approximately equal to the source/drain displacement.

In a fourth implementation, the present invention still further contemplates a detached drain transistor including a semiconductor substrate, a gate dielectric formed on an upper surface of the substrate, a conductive gate formed on the gate dielectric, a first pair of spacer structures, a first source impurity distribution, a second pair of spacer structures, and a drain impurity distribution. The conductive gate is laterally disposed over a channel region of the semiconductor substrate. The channel region extends laterally between a first source region of the semiconductor substrate and a detached drain region of the semiconductor substrate. A channel boundary of the detached region is laterally displaced from a first sidewall of the conductive gate by a drain displacement. A channel boundary of the first source region is laterally displaced from a second sidewall of the conductive gate by a source displacement. The first pair of spacer structures is formed in contact with the first and second sidewalls of the conductive gate. A lateral dimension of the first pair of spacer structures is approximately equal to the source displacement. The first source impurity distribution is substantially contained within the first source region of the semiconductor substrate. The second pair of spacer structures is formed on exterior sidewalls of the first pair of spacer structures such that exterior sidewalls of the second pair of spacer structures are displaced from respective sidewalls of the conductive gate by approximately said drain displacement. The drain impurity distribution is substantially contained within the detached drain region of the semiconductor substrate. Preferably, a lateral dimension of the conductive gate is less than approximately 0.3 microns and the breakdown voltage of the transistor is greater than approximately 7 volts. In a presently preferred embodiment, the source displacement is approximately 50 to 400 angstroms while the drain displacement is approximately 500 to 1500 angstroms. In one embodiment, the first pair of spacer structures comprises silicon nitride. The first source impurity distribution preferably includes ions of arsenic, boron, or phosphorous and has a peak concentration in the approximate range of $1 \times 10^{17}$ to $5 \times 10^{20}$ atoms/cm$^3$. In one embodiment, the transistor further includes a second source impurity distribution substantially contained within a second source region of the semiconductor substrate. An interior boundary of the second source region is laterally displaced from the second sidewall of the conductive gate by approximately said drain displacement. A peak concentration of the second source impurity distribution is approximately equal to a peak concentration of the drain impurity distribution such that the second source impurity distribution represents a mirror image of the drain impurity distribution. In one embodiment, the second pair of spacer structures is comprised of oxide.

In a fifth implementation, the present invention still further contemplates a semiconductor manufacturing process comprising providing a semiconductor substrate, forming a gate dielectric on an upper surface of the semiconductor substrate, forming a conductive gate on an upper surface of the gate dielectric, forming a first pair of spacer structures on the first and second sidewalls of the conductive gate, introducing a first source impurity distribution into the semiconductor substrate, forming a second pair of spacer structures on respective exterior sidewalls of the first pair of spacer structures, and introducing a drain impurity distribution into the detached drain region of the semiconductor substrate. The semiconductor substrate includes a channel region laterally displaced between a first source region and a detached drain region. The conductive gate is formed on the gate dielectric such that the conductive gate includes a first and a second sidewall. The first pair of spacer structures is formed on the sidewalls of the conductive gate such that exterior sidewalls of the first pair of spacer structures are displaced from the first and second sidewalls of the conductive gate by a source displacement. The first impurity distribution is introduced into the first source region of the semiconductor substrate wherein a channel boundary of the first source region is laterally displaced from the second sidewall of the conductive gate by the source displacement. The first source region extends to a first source depth below the upper surface of the semiconductor substrate. The formation of the second pair of spacer structures on the exterior sidewalls of the first pair of spacer structures is accomplished such that exterior sidewalls of the second pair of spacer structures are laterally displaced from the first and second sidewalls of the conductive gate by a drain displacement. The introduction of the drain impurity distribution into the detached drain region of the substrate is accomplished such that a channel boundary of the detached drain region is laterally displaced from the first sidewall of the conductive gate by the drain displacement. The conductive gate may comprise heavily doped CVD polysilicon or, alternatively, the conductive gate may be formed from a metal such as aluminum, copper, tungsten, or alloys thereof. In one embodiment, the process of forming the first pair of spacer structures includes chemically vapor depositing a substantially conformal first dielectric layer on the topography cooperatively defined by the conductive gate and the upper surface of the semiconductor substrate. The conformal deposition of the first dielectric layer in this embodiment is preferably carried out at a pressure less than approximately 2 torrs. The first dielectric layer is then anisotropically etched to remove portions of the first dielectric layer over portions of the topography that are substantially parallel with the upper surface of the semiconductor substrate. In one presently preferred embodiment, the first dielectric layer comprises silicon nitride. In one embodiment, the process of forming the second pair of spacer structures includes chemically vapor depositing a substantially conformal second dielectric layer on the topography cooperatively defined the conductive gate and the upper surface of the semiconductor substrate. Thereafter, the second dielectric layer is anisotropically etched to remove portions of the second dielectric layer above portions of the topography that are substantially parallel with the upper surface of the semiconductor substrate.

The present invention still further contemplates an integrated circuit comprising a semiconductor substrate, a gate dielectric formed on an upper surface of the semiconductor substrate, first and second conductive gates, first and second gate insulators, a lightly doped impurity distribution, a first source/drain impurity distribution, and a second source/drain impurity distribution. The semiconductor substrate includes a first transistor region laterally displaced from a second transistor region. The first and second conductive gates are formed on the gate dielectric over the first and second transistor regions respectively. The conductive gates each include a first and a second sidewall. The first and second gate insulators are formed in contact with the sidewalls of the first and second conductive gates, respectively. The lightly doped impurity distribution is substantially contained within lightly doped source/drain regions laterally displaced on either side of the channel region of the second transistor region. The channel boundaries of the lightly doped source/drain regions are approximately coincident with the lateral position of the first and second sidewalls of the second conductive gate. The first source/drain impurity distribution is substantially contained within first source/drain regions that are laterally displaced on either side of a channel region of the first transistor region. The channel boundaries of the first source/drain impurity distribution are laterally displaced from the first and second sidewalls of the first conductive gate by a first displacement. The second source/drain impurity distribution is substantially contained within the second source/drain regions of the first transistor region. The interior boundaries of the second source/drain regions are laterally displaced from first and second sidewalls of the first conductive gate by a second displacement. The second displacement is greater than the first displacement. Preferably, the first and second gate insulators comprise oxide and a thickness of the gate insulators is approximately 50 to 100 angstroms. The lightly doped impurity distribution preferably includes ions of arsenic, boron, or phosphorous having a peak concentration less than approximately $5 \times 10^{17}$ atoms/cm$^3$. A peak concentration of the first source/drain impurity distribution is preferably in the range of approximately $1 \times 10^{17}$ to $5 \times 10^{20}$ atoms/cm$^3$. A peak concentration of the second source/drain impurity distribution is preferably greater than approximately $1 \times 10^{19}$ atoms/cm$^3$. The first displacement is preferably in the range of approximately 100 to 300 angstroms. The second displacement is ideally greater than the first displacement and the second displacement is in the range of approximately 200 to 400 angstroms. In a preferred embodiment, the lateral dimension of the first conductive gate is less than approximately 0.3 microns and the breakdown voltage of the first transistor is greater than approximately 7 volts.

The present invention still further contemplates an integrated circuit manufacturing process comprising providing a semiconductor substrate, forming a gate dielectric on an upper surface of the semiconductor substrate, forming a first and a second conductive gate on the gate dielectric, introducing a lightly doped impurity distribution into the semiconductor substrate, forming a first and a second gate insulator, forming a first pair of dielectric spacers, introducing a first source/drain impurity distribution into the semiconductor substrate, removing the first pair of spacer structures, forming a second pair of spacer structures, and introducing a second source/drain impurity distribution into the semiconductor substrate. The semiconductor substrate includes a first transistor region laterally displaced from a second transistor region. The first and second conductive gates are formed over the first and second transistor regions respectively of the semiconductor substrate. The first and second conductive gates each include a first and second sidewall. The lightly doped impurity distribution is introduced into a first and a second lightly doped impurity region. The first and second lightly doped impurity regions are laterally displaced on either side of a channel region of the second transistor region. The channel boundaries of the first and second lightly doped impurity distributions are approximately coincident with lateral positions of the first and second sidewalls of the second conductive gate. The first and second gate insulators are formed in contact with the sidewalls of the first and second conductive gates respectively. The first pair of dielectric spacers are formed on exterior sidewalls of the first gate insulator such that exterior sidewalls of the first pair of spacer structures are laterally displaced from first and second sidewalls respectively of the conductive gate by a first displacement distance. The first source/drain impurity distribution is introduced into a pair of first source/drain regions. The first pair of source/drain regions are laterally displaced on either side of a channel region of the first transistor region. The channel boundaries of the first and second source/drain regions are laterally displaced from the first and second sidewalls of the first conductive gate by the first displacement distance. The second pair of spacer structures are formed on exterior sidewalls of the first gate insulator such that exterior walls of the second pair of spacer structures are laterally displaced from the first and second sidewalls of the first conductive gate by a second displacement distance. The second source/drain impurity distribution is introduced into the pair of second source/drain regions. The pair of second source/drain regions are laterally displaced on either side of the channel region of the first transistor region. Interior boundaries of the second pair of source/drain regions are laterally displaced from first and second sidewalls of the first conductive gate by the second displacement. The step of forming the gate dielectric comprises thermally oxidizing of the upper surface of the semiconductor substrate at a temperature greater than approximately 800° C. for a duration sufficient to produce a thickness of the gate dielectric approximately 20 to 200 angstroms. The formation of the first and second conductive gates may comprise chemically vapor depositing polysilicon or, alternatively, sputter depositing a metal such as aluminum, copper, or tungsten.

In one embodiment, the step of forming the first and second gate insulators comprises thermally oxidizing exposed surfaces including the sidewalls of the first and second conductive gates. In one preferred embodiment, the step of depositing the first spacer dielectric material comprises chemically vapor depositing silicon nitride. The formation of the second pair of dielectric spacers, in one embodiment, may include depositing a second spacer dielectric material on a topography cooperatively defined by the first and second conductive gates. The first and second conductive gates, the first and second gate insulators, and the upper surface of the semiconductor substrate. The deposition of the second spacer dielectric material is preferably accomplished at a pressure less than approximately 2 torrs such that a substantially conformal second spacer dielectric layer is produced. Thereafter, the second spacer dielectric material is anisotropically etched such that portions of the second spacer dielectric material are removed from planar surfaces of the topography. For purposes of this disclosure, a planar surface refers to a surface substantially parallel with the upper surface of the semiconductor substrate. The deposition of the second spacer dielectric material preferably comprises chemical vapor depositing oxide. In one embodiment, the formation of the first and second conductive gate includes the steps of sputter depositing a metal of aluminum, copper, or an alloy thereof onto the gate dielectric and patterning the metal with a photolithography masking step. Ideally, the steps of introducing the various impurity distributions into the semiconductor substrate comprise implanting ions of arsenic, boron or phosphorous. In one such embodiment, an implant dose for the step of introducing the lightly doped impurity distributions into the semiconductor substrate is less than approximately $5 \times 10^{14}$ atoms/cm$^2$. A suitable implant dose for the step of introducing the first source/drain impurity distribution into the semiconductor substrate is in the range of approximately $2 \times 10^{12}$ to $5 \times 10^{15}$ atoms/cm$^2$. A suitable implant dose for the introduction of the second source/drain impurity distribution into the semiconductor substrate is preferably greater than approximately $5 \times 10^{14}$ atoms/cm$^2$.

BRIEF DESCRIPTION OF THE DRAWINGS

Other objects and advantages of the present invention will become apparent upon reading the following detailed description and upon reference to the accompanying drawings in which.

Figure 1:
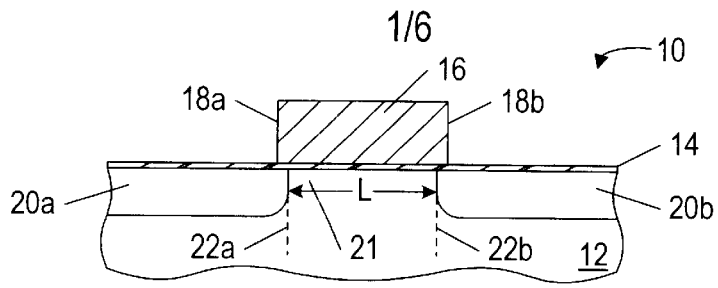
FIG. 1 is a partial cross-sectional view of a semiconductor transistor.
Figure 2:
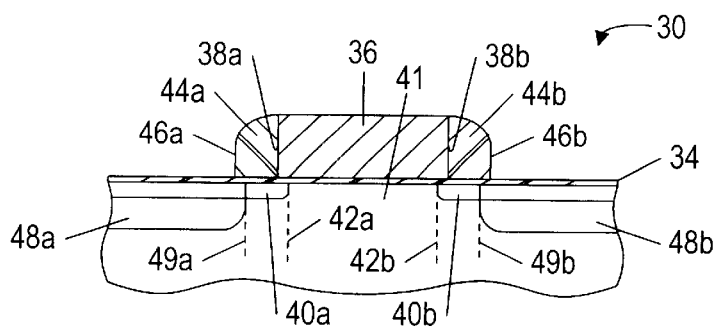
FIG. 2 is a partial cross-sectional view of a semiconductor transistor including lightly doped source/drain regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, five implementations of the present invention are disclosed and will herein be described in detail. FIGS. 3A through 3D disclose a first implementation of a processing sequence for forming a detached drain transistor 300 (shown in FIG. 3D). Detached drain transistor 300 includes semiconductor substrate 302, a source impurity distribution 309, a drain impurity distribution 326a, a gate dielectric 304, and a conductive gate 306 formed on gate dielectric 304. Conductive gate 306 is laterally disposed over a channel region 311 of semiconductor substrate 302. Channel region 311 extends laterally between channel boundary 315 of source region 313 and channel boundary 329 of detached drain region 328a. Channel boundary 329 of detached drain region 328a is laterally displaced from first sidewall 308a of conductive gate 306 by a drain displacement d. Source impurity distribution 309 is substantially contained within source region 313. Similarly, drain impurity distribution 326a is substantially contained within detached drain region 328a of semiconductor substrate 302. It will be appreciated to those skilled in the art of semiconductor processing that impurity distributions such as source impurity distribution 309 and drain impurity distribution 326a represent concentrated populations of ions commonly found in semiconductor application such as phosphorous, arsenic, and boron. Because impurity distributions found within semiconductor substrates do not have discreet boundaries, the impurity regions shown in the figures represent boundaries within which greater than 90% of the respective impurity distribution resides. It will be further appreciated that the conductive gate 306 of detached drain transistor 300 does not extend fully to detached drain region 328a. It is theorized that the displacement of drain region 328a away from the lateral position of conductive gate 306 will result in a transistor demonstrating an improved drain breakdown voltage characteristic. For purposes of this disclosure, the drain breakdown voltage (BVDSS) represents the voltage that, when applied to the drain terminal of the transistor, produces a drain current exceeding a predetermined value. BVDSS may be measured by grounding the gate source and substrate terminals of detached drain transistor 300 while ramping the drain bias voltage and monitoring the drain current to detect the onset of current flow from drain region 328a.

Semiconductor substrate 302 preferably comprises single crystal silicon. In one embodiment, semiconductor substrate 302, prior to the processing shown in FIGS. 3A through 3D, includes a bulk region and a lightly doped epitaxial layer formed on top of the bulk. Prior to the processing shown in the figures, a preferred resistivity of semiconductor substrate 302 is in the range of approximately 10 to 15Ω-cm. The source region 313, in a presently preferred embodiment, includes two separate source impurity distributions. First source impurity distribution 314 is introduced into semiconductor substrate 302 prior to the introduction of second source impurity distribution 326b. In this embodiment, first source impurity distribution 314 is substantially contained within first source region 316 while second source impurity distribution 326b is substantially contained within second source region 328b. First source region 316 extends to a first depth x, below the upper surface of the semiconductor substrate while heavily doped source region 328b extends to a second depth $x_2$ wherein second depth x, is greater than first depth x,. Channel boundary 315 of source region 313 also represents the channel boundary of first region 316. Interior boundary 317 of second source region 328b is laterally displaced from channel boundary 315 by a displacement amount approximately equal to the drain displacement d. In this embodiment, source impurity distribution 309 includes first source impurity distribution 314 and second source impurity distribution 326b. First source impurity distribution 314 is substantially contained within first source region 316 while second source impurity distribution 326b is substantially contained within second source region 328b. In one presently preferred embodiment, drain impurity distribution 326a and second source impurity distribution 326b are introduced into semiconductor substrate 302 simultaneously such that their peak concentrations are approximately equal.

Preferably, gate dielectric 304 is a thermal oxide having a thickness of approximately 20 to 200 angstroms. In one embodiment, conductive gate 306 comprises polysilicon. In such an embodiment, the polysilicon is typically heavily doped with an appropriate impurity to reduce the sheet resistivity of the polysilicon to less than approximately 500Ω/square. An appropriate impurity for n-channel transistors includes phosphorous and arsenic while an appropriate impurity for a p-channel transistor would include boron. In an alternative embodiment, conductive gate 306 is formed of a metal such as aluminum, copper, tungsten, and various alloys thereof. As discussed previously, BVDSS is typically a concern only in short channel devices. The present invention contemplates a short channel device in which the BVDSS exceeds approximately 7 volts. Accordingly, in a preferred embodiment a lateral dimension of conductive gate 306 is less than approximately 0.3 microns. In one embodiment, detached drain transistor 300 includes first and second spacer structures 320a and 320b formed respectively on first and second sidewall 308a and 308b of conductive gate 306. The presence of the spacer structure facilitates the displacement of detached drain region 328 from conductive gate 306. As will be appreciated to those skilled in the art, a lateral dimension of spacer structure 320 will approximate the drain displacement d. It is understood that some lateral encroachment of drain impurity distribution 326a will occur and that subsequent processing at elevated temperatures may serve to laterally displace channel boundary 329 towards a lateral position of first sidewall 308a. It is contemplated, however, that by minimizing the subsequent high temperature processing to which detached drain transistor 300 is subjected, the lateral dimension of spacer structures 320 should exceed the drain displacement d by not more than approximately 300 angstroms.

In an n-channel embodiment of detached drain transistor 300, drain impurity distribution 326a, first source impurity distribution 314, and second source impurity distribution 326b all comprise a concentration of phosphorous or arsenic ions. In a p-channel embodiment, these impurity distributions comprise boron ions. In a presently preferred embodiment, a peak concentration of drain impurity distribution 326a and second source impurity distribution 326b is preferably greater than approximately $1\times10^{19}$ atoms/cm$^3$ while a peak concentration of first source impurity distribution 314 is preferably in the range of approximately $1\times10^{17}$ to $5\times10^{20}$ atoms/cm$^2$. A peak concentration of second source impurity distribution 326b is preferably greater than a peak concentration of first source impurity distribution 314. It is theorized that the lateral displacement of drain impurity distribution 326a increases the channel resistance and decreases the saturated drain current of detached drain transistor 300, relative to a more conventional transistor in which the drain impurity distribution is not laterally displaced from the conductive gate. The lower saturated drain current is compensated for by the significantly increased breakdown voltage and, accordingly, reliability of the transistor. The increase in BVDSS allows the circuit designer to decrease the lateral dimension of conductive gate 306 thereby producing a smaller and more reliable transistor. It is contemplated that the decrease in saturated drain current may be adequately compensated for by the decrease in effective channel length and that the decreased channel length will not be accompanied by decreased reliability in the form of a lower breakdown voltage.

Figure 3A:
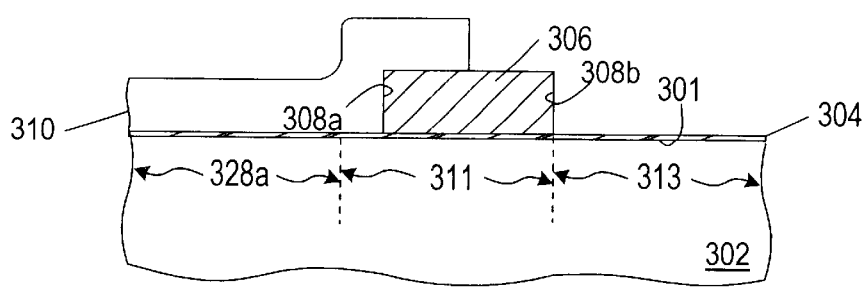
FIG. 3A is a partial cross-sectional view of a semiconductor substrate upon which a gate dielectric and a conductive gate have been formed.

A preferred processing sequence for fabrication of detached drain transistor 300 is shown in FIGS. 3A through 3D. In FIG. 3A a semiconductor substrate 302 is provided. Semiconductor substrate 302 includes a channel region 311 laterally disposed between a source region 313 and a detached drain region 328a. Gate dielectric 304 is then formed on an upper surface 301 of semiconductor substrate 302. Gate dielectric 304 is preferably formed by thermally oxidizing semiconductor substrate 302 in an oxygen bearing ambient maintained at a temperature greater than approximately 800° C. for a duration sufficient to form a thermal oxide film of approximately 20 to 200 angstroms in thickness. The high temperature processing necessary to thermally oxidize semiconductor substrate 302 may be accomplished in a batch type system such as a tube furnace. Alternatively, rapid thermal processing techniques may be employed to fabricate the thermal oxide. In a rapid thermal process, a single wafer is typically subjected to an elevated temperature for a duration comparatively brief with respect to comparable furnace processes. Subsequent to the formation of thermal dielectric 304, conductive gate 306 is formed upon gate dielectric 304 and laterally displaced above channel region 311 of semiconductor substrate 302. In one embodiment, the formation of conductive gate 306 includes the steps of depositing a conductive film upon the gate dielectric and patterning the conductive film with a photolithography masking step as is well known in the field of semiconductor processing, including an anisotropic etch process that produces substantially vertical first and second sidewalls 308a and 308b respectively. In one embodiment, the deposition of the conductive film includes the steps of chemically vapor depositing polysilicon typically at a temperature greater than approximately 500° C. and subsequently introducing a gate impurity into the polysilicon to reduce the sheet resistivity of the polysilicon to less than approximately 500Ω/square. The conductivity type of the impurity preferably matches the conductivity type of the subsequently formed source/drain impurity distributions. As an alternative to the polysilicon process just described, the deposition of the conductive film may comprise sputter depositing a metal such as aluminum, copper, tungsten, or various alloys thereof. Subsequent to the formation of conductive gate 306, patterned photoresist layer 310 is formed to mask detached drain region 326a and exposed portions of channel region 311 thereby leaving source region 313 exposed.

Figure 3B:
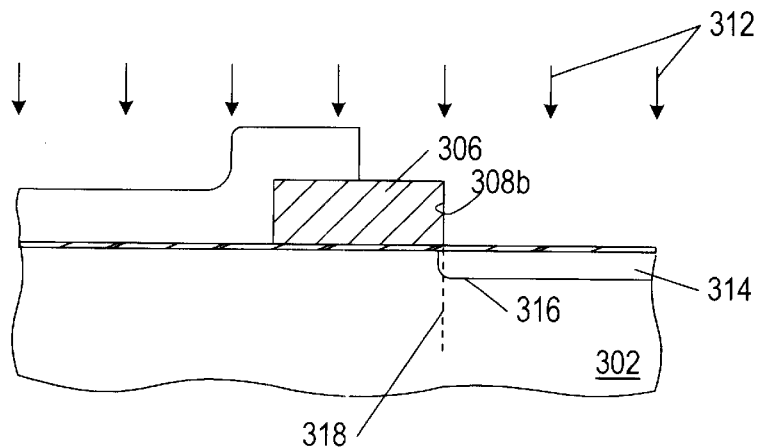
FIG. 3B is a processing step subsequent to FIG. 3A in which a first source impurity distribution has been introduced into the semiconductor substrate.

Turning to FIG. 3B, first source impurity distribution 314 is introduced into first source region 316 of semiconductor substrate 302 with ion implantation step 312. Accordingly, a channel boundary 318 of first source region 316 will be approximately coincident with a lateral position of second sidewall 308b of conductive gate 306. Preferably, implant 312 is performed using an implant energy less than approximately 20 keV and using a dose in an approximate range of $2\times10^{12}$ to $5\times10^{15}$ atoms/cm$^2$.

Figure 3C:
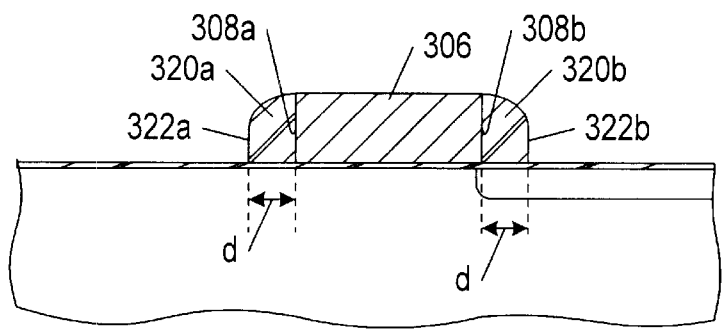
FIG. 3C is a processing step subsequent to FIG. 3B in which spacer structures have been formed on the sidewalls of the conductive gate.
Figure 3D:
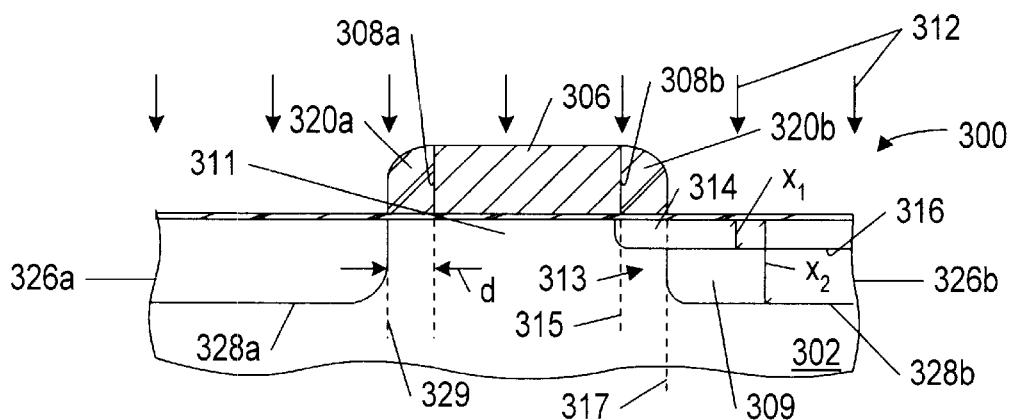
FIG. 3D is a processing step subsequent to FIG. 3C in which an impurity distribution has been introduced into source/drain regions displaced from sidewalls of the conductive gate.

Turning to FIG. 3C, spacer structures 320a and 320b are formed on respective sidewalls 308a and 308b of conductive gate 306. The formation of spacer structures such as spacer structure 320a and 320b is well known in the field and is accomplished by depositing a substantially conformal dielectric film upon the topography defined by the conductive gate 306 and upper surface 301 of semiconductor substrate 302. For purposes of this disclosure, a substantially conformal film refers to a film wherein a thickness of the film in horizontal regions of the film is within 20% of the film thickness in vertical regions. Formation of a conformal dielectric layer is facilitated by low pressure (i.e., less than 2 torrs) chemical vapor deposition. In a preferred embodiment, the formation of spacer structures 320a and 320b is accomplished by chemically vapor depositing an oxide film from a TEOS or silane source at a pressure less than approximately 2 torrs. Thereafter, the oxide film is anisotropically etched to clear horizontal portions of the film. The lateral dimensions of the spacer structure so formed will directly influence the lateral displacement of the detached drain region. In FIG. 3D, a source/drain impurity distribution (326a and 326b) is introduced into drain region 328a and second source/drain region 326b. Implant 324 preferably is performed with an implant dose greater than approximately $5\times10^{14}$ atoms/cm$^2$.

Figure 4A:
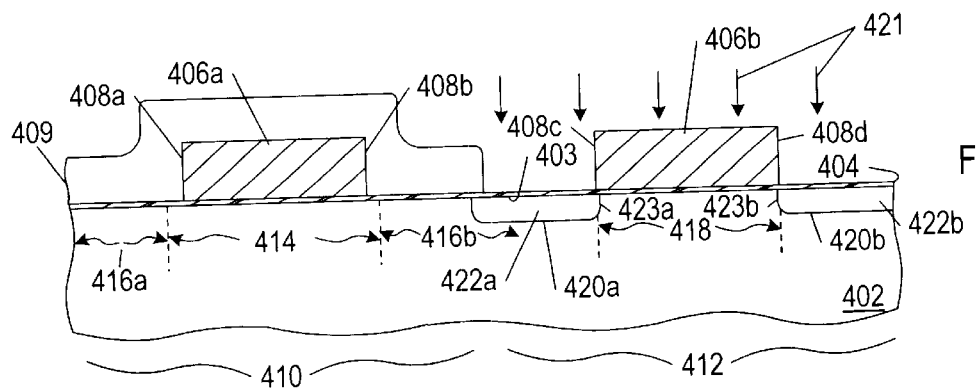
FIG. 4A is a partial cross-sectional view of a first and a second conductive gate formed over a semiconductor substrate after a lightly doped impurity distribution has been introduced into the substrate.
Figure 4B:
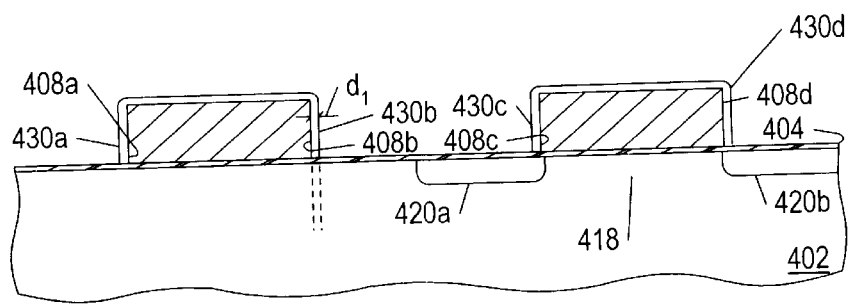
FIG. 4B is a processing step subsequent to FIG. 4A in which gate insulators have been formed in contact with the sidewalls of the first and second conductive gate.
Figure 4C:
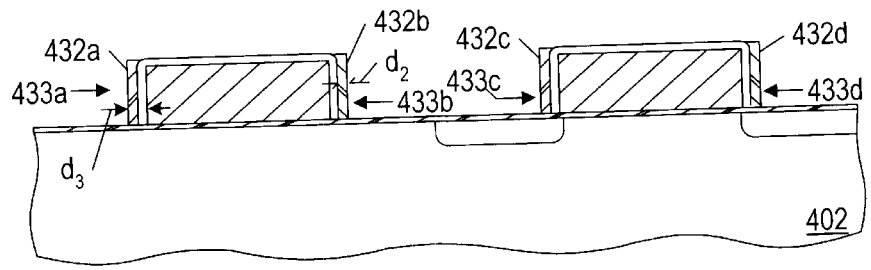
FIG. 4C is a processing step subsequent to FIG. 4B in which spacer structures have been formed on the exterior sidewalls of the first and second gate insulator.
Figure 4D:
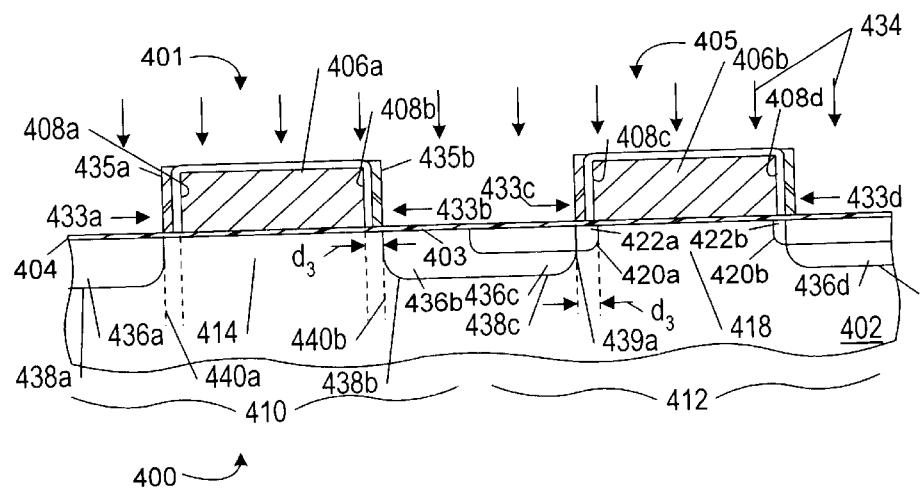
FIG. 4D is a processing step subsequent to FIG. 4C in which an impurity distribution has been introduced into regions of the semiconductor substrate that are laterally displaced from sidewalls of the first and second conductive gate.

FIGS. 4A through 4D depict a second implementation of the present invention. FIG. 4D shows an integrated circuit 400 comprised of a first transistor 401 and a second transistor 405 formed within a first transistor region 410 and a second transistor region 412 respectively of a semiconductor substrate 402. The first transistor 401 includes a gate dielectric 404 formed on upper surface of semiconductor substrate 402, a conductive gate 406a formed on the gate dielectric 404, and a source/drain impurity distribution 436 substantially contained within a pair of detached source/drain regions 438a and 438b of semiconductor substrate 402. Conductive gate 406a of first transistor 401 includes a first and a second sidewall 408a and 408b. First and second sidewalls 408a and 408b are laterally displaced from respective channel boundaries 440a and 440b of the pair of detached source/drain regions 438a and 438b by a source/drain displacement $d_3$. Accordingly, a lateral dimension of conductive gates 406a is less than a lateral dimension between channel boundaries 440a and 440b of detached source/drain regions 438a and 438b respectively. Like the first implementation of the present invention disclosed with respect to FIGS. 3A through 3D, a suitable starting material for semiconductor substrate 402 is a single crystal silicon having a resistivity in the range of approximately 10–15Ω-cm. Gate dielectric 404 is preferably an oxide having a thickness of approximately 20–200 angstroms and conductive gates 406a and 406b may comprise polysilicon suitably doped to reduce the sheet resistivity of the polysilicon to less than approximately 500Ω/square. Alternatively, conductive gate 406a and 406b may comprise a metal such as aluminum, copper, tungsten, and suitable alloys. Integrated circuit 400 further includes second transistor 405. Second transistor 405 includes a second conductive gate 406b formed on gate dielectric 404 over second transistor region 412 of semiconductor substrate 402, a lightly doped impurity distribution 422 substantially contained within a pair of lightly doped impurity regions 420a and 420b laterally displaced on either side of a channel region 418 of second transistor region 412, and a heavily doped impurity distribution 436 substantially contained within a pair of heavily doped impurity regions 438c and 438d laterally displaced on either side of channel region 418. Channel boundaries of the pair of lightly doped impurity regions 420a and 420b are approximately coincident with lateral positions of respective sidewalls 408c and 408d of second conductive gate 406b. Interior boundaries 439a and 439b of the heavily doped regions 438c and 438d respectively are displaced from first and second sidewalls 408c and 408d of second conductive gate 406b by approximately the source/drain displacement $d_3$. A peak concentration of the lightly doped impurity distributions 422 is less than approximately $5\times10^{17}$ atoms/cm$^2$ while a peak concentration of the heavily doped impurity distribution 436 is greater than approximately $1\times10^{19}$ atoms/cm$^3$.

In a preferred embodiment, first transistor 401 further includes a gate insulator 433 formed in contact with first and second sidewalls 408a and 408b of conductive gate 406a. Exterior side walls of gate insulator 433 are laterally displaced from respective sidewalls of first conductive gate 406a by approximately the source/drain displacement $d_3$. In one embodiment, gate insulator 433 includes an inner insulator 430 comprised of a first dielectric material and an outer insulator 432 comprised of a second insulator material. Inner insulator 430, in one embodiment, is comprised of an oxide material while outer insulator 432 is comprised of silicon nitride. A preferred thickness of the inner insulator is approximately 50 to 100 angstroms while a preferred thickness of the outer insulator is less than or equal to approximately 200 angstroms. In the presently preferred embodiment, a lateral dimension of first conductive gate 406a is less than approximately 0.3 microns and breakdown voltage of first transistor 401 is greater than approximately 7 volts. The source/drain displacement $d_3$ is preferably in the approximate range of 200 to 300angstroms. The present invention still further contemplates a semiconductor manufacturing process performing a first transistor 401. The process includes the steps of providing semiconductor substrate 402, forming gate dielectric 404 upon an upper surface of semiconductor substrate 402, forming first conductive gate 406a on an upper surface of gate dielectric 404, and introducing a source/drain impurity distribution 436 into a pair of detached source/drain regions 438a and 438b of semiconductor substrate 402. The pair of detached source/drain regions 438a and 438b are laterally displaced on either side of a channel region 414 within first transistor region 410 of the semiconductor substrate 402. Conductive gate 406a is formed such that first and second sidewalls 408a and 408b respectively are laterally displaced from respective channel boundaries 440a and 440b of the pair of detached source/drain regions 438a and 43b such that a displacement between the channel boundaries 440a and 440b is greater than a lateral dimension of first conductive gate 406a. Similar to the process for forming the transistor of the first implementation of the present invention, the step of forming gate dielectric 404 preferably comprises thermally oxidizing an upper surface of semiconductor substrate 402 at a temperature greater than approximately 800° C. for a duration sufficient to fabricate a gate dielectric of approximately 20–200 angstroms in thickness. The preferred process forms first conductive gate 406a and second conductive gate 406b, in one embodiment, by chemically vapor depositing polysilicon, introducing a gate impurity distribution into the polysilicon, and patterning the polysilicon with a photolithography masking step. Alternatively, a metal gate process may be suitably employed in which conductive gates 406a and 406b are formed by sputter depositing and metal such as aluminum, copper, tungsten, or alloys thereof onto the gate dielectric 404, and patterning the metal with a photolithography masking step. In a preferred embodiment, the process further includes, prior to the step of introducing the source/drain impurity distribution, thermally oxidizing conductive gates 406a and 406b to form an inner gate insulator 430 in contact with sidewalls 408 of first and second conductive gates 406a and 406b. A preferred thickness of inner gate insulator 430 is approximately 50 to 100 angstroms. Thereafter, an outer gate insulator 432 is formed upon exterior sidewalls of inner gate insulator 430. A preferred thickness of outer gate insulator 432 is approximately 150 to 250 angstroms. In one presently preferred embodiment, outer gate insulator 432 is formed by depositing silicon nitride upon a topography cooperatively defined by the first gate insulator and the upper surface of the semiconductor substrate, and, thereafter, isotropically etching the silicon nitride layer to remove portions of the silicon nitride layers that are substantially parallel to the upper surface of the semiconductor substrate. In this manner, the outer gate insulator 432 comprises a set of space or structures in contact with exterior sidewalls of inner gate insulator 430.

Lightly doped impurity distribution 422 is introduced into the pair of lightly doped source/drain regions 420 and 420b within second transistor region 412 of semiconductor substrate 402 preferably through the use of an ion implantation 421. Prior to performing implantation 421, a photoresist mask 409 is patterned to protect first transistor region 410 from ion implantation 421. With second conductive gate 406b serving as a mask within second region 412, it would be appreciated that channel boundaries 423a and 423b of lightly doped source/drain regions 420a and 420b respectively are approximately coincident with lateral positions of sidewalls 408c and 408d of second conductive gate 406b. In one preferred embodiment, ion implantation 421 is carried out at an implant energy less than approximately 20 keV using a dose of less than approximately $5 \times 10^{14}$ atoms/cm². FIG. 4D discloses that, in one embodiment, the impurity distribution within the pair of detached source/drain regions 438a and 438b and the impurity distribution within the pair of heavily doped source/drain regions 438c and 438d of second transistor region 412 may be simultaneously introduced into their respective regions with a single implantation 434. In a preferred embodiment, this implantation is preferably accomplished using an implant dose of greater than approximately $5 \times 10^{14}$ atoms/cm². FIGS. 4B and 4C disclose that the formation of inner insulator 430 and outer insulator 432 may occur, in one embodiment, simultaneously upon first conductive gate 406a and second conductive gate 406b. In such an embodiment, implant 434 shown in FIG. 4D results in the formation of impurity distributions that are laterally displaced from respective sidewalls of the respective conductive gates. More specifically, the lateral displacement between channel boundaries 440 and conductive gate sidewalls 408 within first transistor region 410 is approximately equal to the lateral displacement between interior boundaries 439 and sidewalls 408 within second transistor region 412. It would be appreciated to those skilled in the art that second transistor 405 resembles a conventionally formed LDD transistor in which lightly doped source/drain regions extend to sidewalls of the conductive gate while more heavily doped source/drain regions are laterally displaced from the sidewalls of the conductive gate. Thus, this implementation results in a process designed to fabricate detached source/drain transistors 401 and conventional LDD transistors 405. In a CMOS embodiment, patterned masking layer 409 may be incorporated into an existing LDD implant mask such that the disclosed process requires no additional masking steps.

Figure 5A:
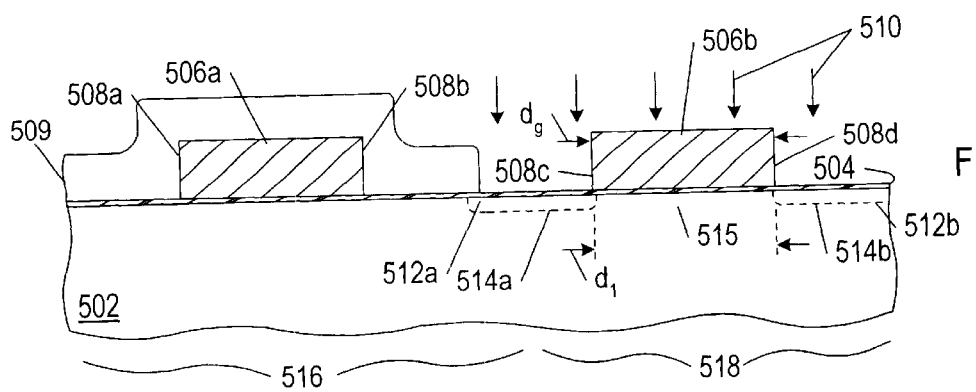
FIG. 5A is a partial cross-sectional view of a first and a second conductive gate after a lightly doped impurity distribution has been introduced into the semiconductor substrate.
Figure 5B:
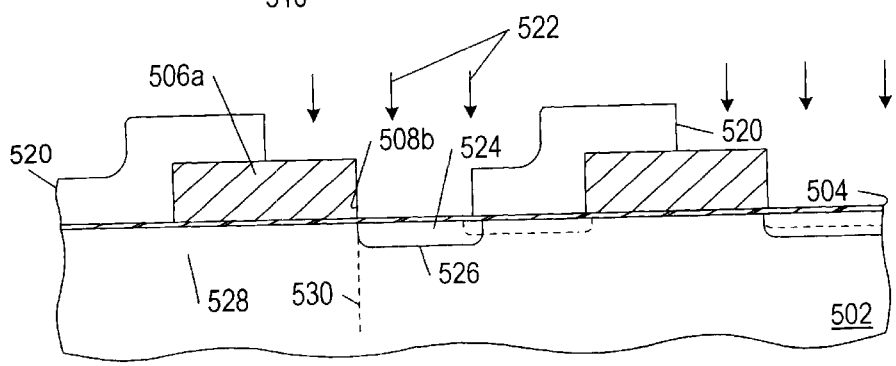
FIG. 5B is a processing step subsequent to FIG. 5A in which a first source impurity distribution has been introduced into a first source region of the semiconductor substrate.
Figure 5C:
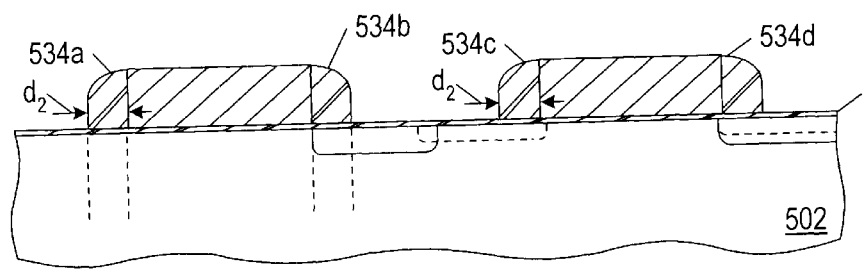
FIG. 5C is a processing step subsequent to FIG. 5B in which spacer structures have been formed on the sidewalls of the first and second conductive gates.
Figure 5D:
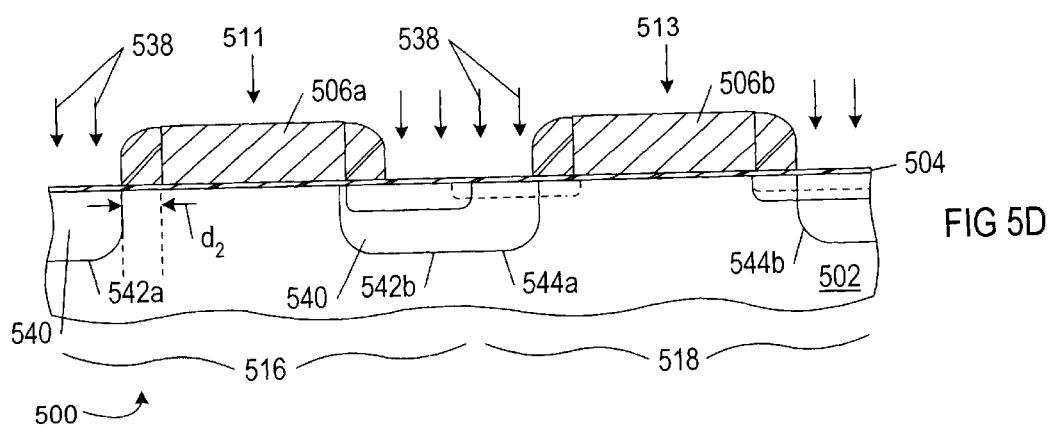
FIG. 5D is a processing step subsequent to FIG. 5C in which an impurity distribution has been introduced into regions of the semiconductor substrate that are laterally displaced from sidewalls of the respective conductive gates.

FIGS. 5A–5D disclose a third implementation of the present invention. FIG. 5D depicts integrated circuit 500 which includes a semiconductor substrate 502, a gate dielectric 504 formed on the semiconductor substrate 504, a first and a second conductive gate 506a and 506b formed on gate dielectric 504 over a first transistor region 516 and a laterally displaced second transistor region 518 respectively, a lightly doped impurity distribution 512 contained within lightly doped source/drain regions 514a and 514b laterally displaced on either side of a channel region 515 within second transistor region 518, a first source impurity distribution 524 substantially contained within a first source region 526 of first transistor region 516 and a detached impurity distribution 540 substantially contained within first and second pairs of detached source/drain regions (shown in the figure with reference numerals 542a, 542b, 544a, and 544b). First conductive gate 506a includes a pair of sidewalls 508a and 508b while second conductive gate 506b includes a pair of sidewalls 508c and 508d. Channel boundaries of lightly doped impurity regions 514a are substantially coincident with lateral positions of first and second sidewalls 508c and 508d of second conductive gate 506b. A peak concentration of lightly doped impurity distribution 512 is less than approximately $5 \times 10^{17}$ atoms/cm³. First source region 526 is laterally displaced with respect to channel region 528 of first transistor region 516. A channel boundary 530 of first source region 526 is laterally coincident with the second sidewall 508b of first conductive gate 506a. A peak concentration of first source impurity distribution 524 is in the approximate range of $1 \times 10^{17}$ to $5 \times 10^{20}$ atoms/cm³. The first pair of detached source/drain regions 542a and 542b are laterally displaced on either side of channel region 528 of first transistor region 516 such that respective interior boundaries of detached source/drain regions 542a and 542b are laterally displaced from respective sidewalls of first conductive gate 506a by a source/drain displacement $d_2$. The second pair of detached source/drain regions 544a and 544b are similarly displaced such that interior boundaries of the second pair of detached source/drain regions 544a and 544b are displaced from respective sidewalls of second conductive gate 506b by the source/drain displacement $d_2$.

Similar to the previous two implementations, a preferred starting material semiconductor substrate 502 comprises single crystal silicon having a resistivity of approximately 10 to 15Ω-cm. A preferred gate dielectric 504 comprises a thermal oxide having a thickness of approximately 20 to 200 angstroms. In a preferred embodiment, integrated circuit 500 further includes a first pair of spacer structures 534a and 534b and a second pair of spacer structures 534c and 534d in contact with respective pairs of sidewalls of the first conductive gate 506a and second conductive gate 506b. Each of the spacer structures has a thickness approximately equal to the source/drain displacement $d_2$. In one presently preferred embodiment, the spacer structure thickness is approximately 500 to 1000 angstroms. A lateral dimension of first conductive gate 506a is preferably less than approximately 0.3 microns. First and second conductive gates 506a and 506b comprise heavily doped polysilicon (i.e., polysilicon having a sheet resistivity less than approximately 500Ω/square). Alternatively, first and second conductive gates 506a and 506b may comprise a metal such as aluminum, copper, tungsten, or a suitable alloy.

One skilled in the art of semiconductor processing will recognize in FIG. 5D that the present implementation includes a first transistor 511 and second transistor 513. First transistor 511 is of a type similar to the detached drain transistor disclosed with respect to FIGS. 3A–3D while second transistor 513 comprises an LDD type transistor. The integration of the detached drain transistors with the more conventional transistors enables the present invention to incorporate the improved BVDSS characteristics of the detached drain transistor 511 into selected transistors while maintaining higher drive currents associated with second transistor 513 in selected transistors. The integration of these two types of transistors is accomplished with a single additional masking step (or possibly two additional masking steps in a CMOS process).

Turning back now to FIG. 5A, the process performing integrated circuit 500 will be described. In FIG. 5A, first and second conductive gates 506a and 506b have been formed on a gate dielectric 504 over a semiconductor substrate 502. The formation of gate dielectric 504 preferably comprises thermally oxidizing semiconductor substrate 502 as previously described with respect to the first and second implementations of the present invention. As in the first two implementations, first and second conductive gates 506a and 506b may be formed of polysilicon, or, alternatively, a metal such as aluminum, copper, tungsten, or a suitable alloy thereof. Subsequent to the formation of first and second conductive gates 506a and 506b, a patterned masking layer 509 is formed to protect first transistor region 516 from a subsequent implant. Thereafter, lightly doped source/drain impurity distribution 512 is introduced into a pair of lightly doped source/drain regions 514a and 514b laterally disposed on either side of a channel region of semiconductor substrate 502. The presence of second conductive gate 506b results in an approximate alignment between the channel boundaries of source/drain regions 514a and 514b and respective sidewalls 508c and 508d of second conductive gate 506b. Implant 510 is preferably accomplished using an implant energy less than approximately 20 keV and an implant dose less than approximately $5\times10^{14}$ atoms/cm$^2$. It would be appreciated to those skilled in the art, that, in a CMOS embodiment of the present invention, pattern masking layer 509 may be integrated with an existing LDD mask such that pattern masking layer 509 does not represent an additional masking step. More specifically, in a CMOS embodiment in which a P-type lightly doped impurity distribution is introduced into P-type regions of the semiconductor substrate while an N-type impurity distribution is introduced into N-channel regions of the semiconductor substrate, a pattern masking layer is already necessary to prevent the introduction of the N-type lightly doped impurity distribution into the P-type region of the semiconductor substrate, and, conversely, a pattern masking layer is generally required to prevent the introduction of the P-type lightly doped impurity distribution into the N-type transistor regions of the semiconductor substrate.

Turning to FIG. 5B, a second pattern masking layer 520 is formed to protect second transistor region 518 and portions of first transistor region 516. More specifically, pattern masking layer 520 is designed to prevent the introduction of a subsequent implant into either the channel region 528 or the detached drain region 542a (shown in FIG. 5D) of semiconductor substrate 502. Subsequent to the formation of pattern masking layer 520, ion implantation 522 is formed to introduce first source impurity distribution 524 into first source region 526 of first transistor region 516. As would be appreciated to those skilled in the art, a channel boundary 530 of first source region 526 will be laterally aligned with second sidewall 508b of first conductive gate 506a subsequent to the second implant 522. In a presently preferred embodiment, implant 522 is preferably accomplished using a dose in the range of approximately $2\times10^{12}$ to $5\times10^{15}$ atoms/cm$^2$.

Turning now to FIG. 5C a preferred processing step is shown in which spacer structures 534 are formed in contact with sidewalls 508 of the conductive gates 506. The spacer structures have a thickness $d_2$ approximately equal to the source/drain displacement. Spacer structures 534 facilitate the displacement of subsequently formed impurity distribution within semiconductor substrate 502. The formation of spacer structures 534 are preferably accomplished, in this implementation, by chemically vapor depositing a dielectric such as an oxide formed from a TEOS or silane source. The deposition is preferably performed at a pressure less than approximately 2 torrs to increase the conformality of the deposited film. Subsequent to the oxide deposition, an anisotropic etch process is performed to remove the horizontal portions of the dielectric film leaving behind portions of the film only on vertical portions of the topography. In one presently preferred embodiment, the thickness $d_2$ of spacer structures 534 is approximately 500 to 1000 angstroms.

FIG. 5D shows the introduction of a detached source/drain impurity distribution 540 into detached source/drain regions 542a and 542b of semiconductor substrate 502 within first transistor region 516. In the preferred embodiment, detached impurity distribution 540 is introduced into detached source/drain regions 542 through the use of an ion implantation step 538. The presence of spacer structures 534 results in the displacement of detached impurity distribution 540 from sidewalls 508 of conductive gate 506a where the displacement is approximately equal to the source/drain displacement $d_2$. In the preferred embodiment, ion implantation 538 is preferably carried out at an implant dose greater than approximately $5\times10^{14}$ atoms/cm$^2$. In one presently preferred embodiment designed for use in manufacturing integrated circuits that employ both detached drain transistors, such as transistor 511, and conventionally formed transistors such as transistor 513, ion implantation 538 simultaneously introduces a heavily doped source/drain impurity distribution into heavily doped source/drain regions 544a and 544b within second transistor region 518. This integration of implant steps results in a process capable of manufacturing at least two types of transistors (i.e., the detached drain type transistor and the more conventional LDD transistor) with only single additional masking step. It will be appreciated to those skilled in the art that masking layer 520 shown in FIG. 5d may be altered such that all of second transistor region 518 is protected during ion implantation 522 thus resulting in a standard LDD type transistor.

Figure 6A:
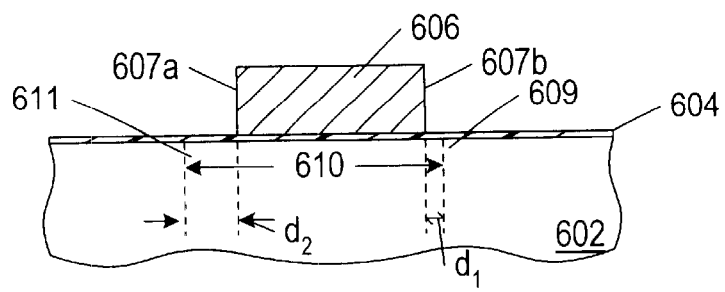
FIG. 6A is a partial cross-sectional view of a semiconductor substrate upon which a gate dielectric and a conductive gate have been formed.
Figure 6B:
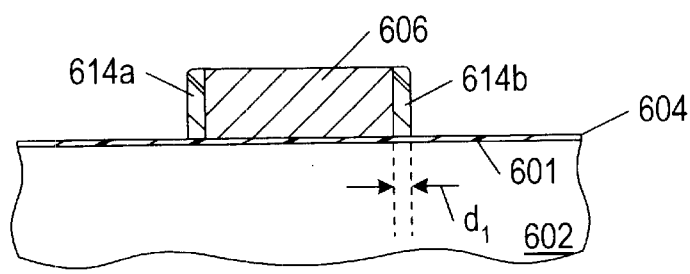
FIG. 6B is a processing step subsequent to FIG. 6A in which a first pair of spacer structures has been formed on the sidewalls of the conductive gate.
Figure 6C:
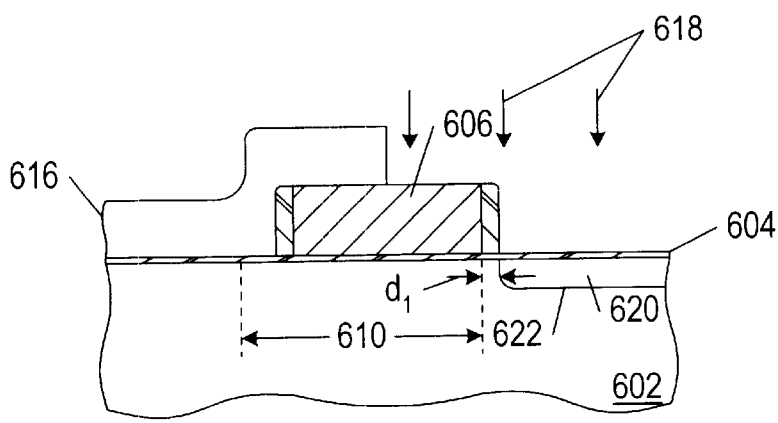
FIG. 6C is a processing step subsequent to FIG. 6B in which a first source impurity distribution has been introduced into a first source region of the semiconductor substrate.
Figure 6D:
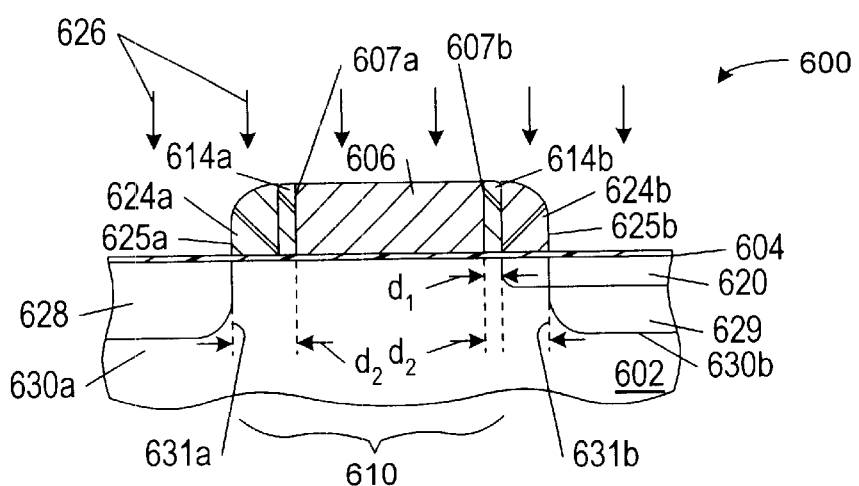
FIG. 6D is a processing step subsequent to FIG. 6C in which an impurity distribution has been introduced into regions of the semiconductor substrate laterally displaced from sidewalls of the conductive gate after a second pair of spacer structures has been formed on the exterior sidewalls of the first pair of spacer structures.

FIGS. 6a through 6d show a fourth implementation of the present invention. Turning to FIG. 6d, a detached drain transistor 600 is shown. Detached drain transistor 600 includes semiconductor substrate 602, gate dielectric 604 formed on an upper surface of semiconductor substrate 602, a conductive gate 606, a first pair of spacer structures 614a and 614b, a first source impurity distribution 620, a second pair of spacer structures 624a and 624b, and a drain impurity distribution 628. Conductive gate 606 is laterally disposed over a channel region 610 of semiconductor substrate 602. Channel region 610 extends laterally between a first source region 622 (shown in FIG. 6C) and a detached drain region 630a (shown in FIG. 6D). The channel boundary 611 of detached drain region 630a is displaced from first sidewall 607a of conductive gate 606 by a drain displacement $d_2$. A channel boundary 609 of first source region 622 is laterally displaced from second sidewall 607b of conductive gate 606 by a source displacement $d_1$. First pair of spacer structures 614a and 614b are formed in contact with first and second sidewalls 607a and 607b respectively of conductive gate 606. A thickness of the first pair of spacer structures is approximately equal to source displacement $d_1$. First source impurity distribution 620 is substantially contained within first source region 622 of semiconductor substrate 602. Second pair of spacer structures 624a and 624b are formed on exterior sidewalls of first pair of spacer structures 614a and 614b respectively. Exterior sidewalls 625a and 625b of second pair of spacer structures 624a and 624b are displaced from respective sidewalls 607a and 607b of conductive gate 606 by approximately the drain displacement $d_2$. Drain impurity distribution 628 is substantially contained within detached drain region 630a. Semiconductor substrate 602 like the substrates disclosed in the first three implementations of the present invention is preferably comprised of a single crystal silicon having a resistivity of approximately 10 to 15Ωcm. The gate dielectric 604 is preferably a thermally formed oxide having a thickness of approximately 20 to 200 angstroms. Conductive gate 606 comprises either polysilicon having a sheet resistivity less than approximately 500Ω/square or a metal of aluminum, copper, tungsten or an alloy thereof. A lateral dimension of conductive gate 606 is preferably less than approximately 0.3 microns and a breakdown voltage of the transistor is preferably greater than 7 volts. Source displacement $d_1$ is approximately 50 to 400 angstroms in a presently preferred embodiment while, in one presently preferred embodiment first pair of spacer structures 614a and 614b are comprised of silicon nitride. First source impurity distribution 620 preferably includes ions of arsenic, boron, or phosphorous and has a peak concentration of approximately $1 \times 10^{17}$ to $5 \times 10^{20}$ atoms/cm$^3$. Drain impurity distribution 628 preferably includes ions of arsenic, boron, or phosphorous and has a peak concentration greater than approximately $1 \times 10^{19}$ atoms/cm$^3$. In one embodiment detached drain transistor 600 further includes a second source impurity distribution 629 substantially contained within a second source region 630b of semiconductor substrate 602. And interior boundary 607b of second source region 630b is laterally displaced from second sidewall 607b of conductive gate 606 by approximately the drain displacement $d_2$. In this embodiment, a peak concentration of the second source impurity distribution 629 is approximately equal to a peak concentration of the drain impurity distribution 628 such that second source impurity distribution 629 substantially mirrors detached drain impurity distribution 628.

Turing now to FIGS. 6A through 6D, a processing sequence is shown for forming detached drain transistor 600. In FIG. 6A, a conductive gate 606 is formed on a gate dielectric 604 over a channel region 610 of semiconductor substrate 602. Channel region 610 extends laterally between a channel boundary 611 of a detached drain region 630a (shown in FIG. 6D) and a channel boundary 609 of first source region 622 (shown in FIG. 6C). Gate dielectric 604 is formed on an upper surface of semiconductor substrate 602 with a thermal oxidation process such as a rapid thermal anneal or a tube furnace process as discussed previously with respect to FIGS. 3A through 3D. The thermal oxidation process is preferably continued for a duration sufficient to produce a thermal oxide 604 having a thickness of approximately 20 to 200 angstroms. Thereafter, conductive gate 606 is formed by depositing a conductive material upon gate dielectric 604 and patterning the conductive material with a photolithography/etch step as is well known in the field. The deposition of the conductive material in one embodiment includes the chemical vapor deposition of polysilicon followed by the introduction of an impurity distribution into the polysilicon to reduce the sheet resistivity of the polysilicon to less than approximately 500Ω/square. Alternatively, conductive gate 606 may be formed by depositing a metal with a sputter deposition process. Suitable metals include copper, aluminum, and tungsten. Alloys of these elements may also be suitably employed. In FIG. 6B, a first pair of spacer structures 614 is formed on sidewall 607a and 607b of conductive gate 606. In the presently preferred embodiment, first pair of spacer structures 614 are fabricated by chemically vapor depositing silicon nitride at a pressure less than approximately 2 torrs to form a conformal silicon nitride layer on the topography defined by conductive gate 606 and upper surface 601 of semiconductor substrate 602. Subsequent to the deposition, a spacer etch process is performed to produce spacer structure 614a and 614b. The spacer etch, as will be appreciated to those skilled in the art of semiconductor etch technology, is typically an anisotropic etch process that is executed with minimum overetch such that portions of the etched film that are parallel to the wafer surface are removed whereas vertical portions of the film are left behind. For purposes of this disclosure, a minimum overetch process is an etch process in which the overetch cycle is less than approximately 10% of the main etch cycle. In the presently preferred embodiment, a thickness of the first pair of spacer structures 614a and 614b is approximately 50 to 400 angstroms. The first pair of spacer structure 614a and 614b are designed to displace the source region of the transistor a small lateral displacement from the sidewall of the conductive gate.

Turning to FIG. 6c, a first source impurity distribution 620 is introduced into a first source region 622 of semiconductor substrate 602 through the use of an ion implantation process 618. Prior to the implantation, a photoresist mask 616 is patterned to protect exposed portions of channel region 610 and detached drain region 630a of semiconductor substrate 602. Preferably, ion implantation 618 is performed using an implant energy less than approximately 20 keV at an implant dose less than approximately $5 \times 10^{14}$ atoms/cm$^2$. Turning to FIG. 6D, detached drain transistor 600 is completed with the introduction of detached drain impurity distribution 628 into detached drain region 630a of semiconductor substrate 602. In the preferred embodiment, an ion implantation step 626 is used to introduce detached drain impurity distribution 628 into semiconductor substrate 602 and, simultaneously, to introduce second source impurity distribution 629 into second source region 630b. Prior to performing ion implantation 626, a second pair of spacer structures 624a and 624b are formed upon exterior sidewalls of first pair of spacer structures 614a and 614b respectively. Second pair of spacer structures 624a and 624b are fabricated such that exterior sidewalls 625a and 625b of the second pair of spacer structures is displaced from respective sidewalls 607a and 607b of conductive gate 606 by a drain displacement $d_2$. The formation of second pair of spacer structures 624a and 624b, in a preferred embodiment, is accomplished by chemically vapor depositing an oxide preferably formed from a TEOS or silane source and following the deposition with a spacer etch process as described above with respect to FIGS. 6b.

Figure 7A:
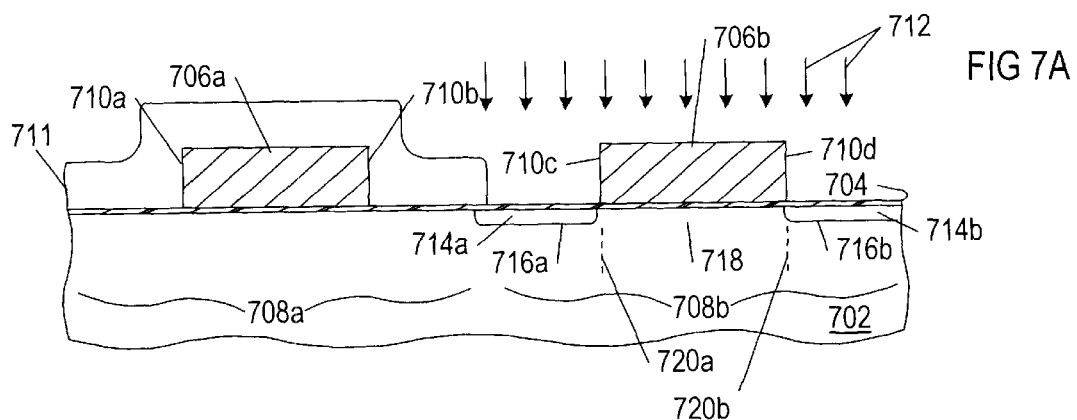
FIG. 7A is a partial cross-sectional view of a first and second conductive gate formed on a gate dielectric over a semiconductor substrate after a lightly doped impurity distribution has been introduced into the semiconductor substrate.
Figure 7B:
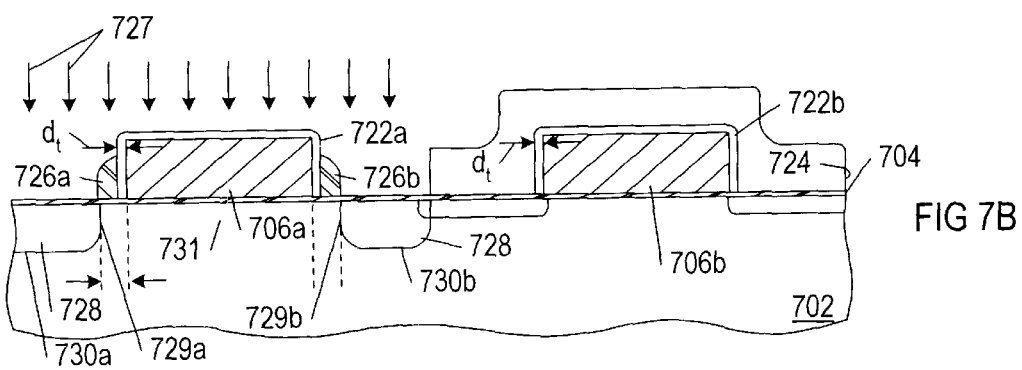
FIG. 7B is a processing step subsequent to FIG. 7A in which an impurity distribution has been introduced into regions of the semiconductor substrate laterally displaced from the sidewalls of the first and second conductive gate after the formation of a gate insulator and a first pair of spacer structures.
Figure 7C:
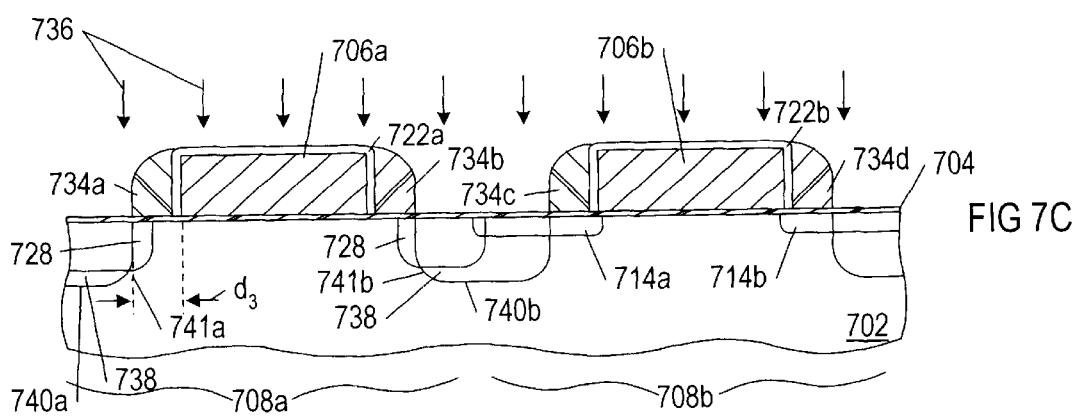
FIG. 7C is a processing step subsequent 7B in which an impurity distribution is introduced into regions of the semiconductor substrate laterally displaced from sidewalls of the first and second conductive gate after the formation of a second spacer structure upon the exterior walls of the gate insulator.

FIGS. 7A through 7C depict a fifth implementation of the present invention. In FIGS. 7C integrated circuit 700 is shown as including a semiconductor substrate 702, a gate dielectric 704 formed on an upper surface of semiconductor substrate 702, first and second conductive gates 706a and 706b respectively formed on an upper surface of gate dielectric 704, first and second gate insulators 722a and 722b formed in contact with sidewalls of the first and second conductive gates 706a and 706b, a lightly doped impurity distribution 714a and 714b, a first source/drain impurity distribution 728, and a second source/drain impurity distribution 738. Semiconductor substrate 702 includes a first transistor region 708a and a laterally displaced second transistor region 708b. First and second conductive gates 706a and 706b are formed over first and second transistor regions 708a and 708b respectively. Each conductive gate 706a includes a first sidewall (710a and 710c respectively) and a second sidewall (710b and 710d). Lightly doped impurity distribution 714a and 714b are substantially contained within lightly doped impurity regions 716a and 716b of second transistor region 708b. Channel boundaries 720a and 720b of lightly doped source/drain regions 716a and 716b are approximately coincident with respective lateral positions of first and second sidewalls 710c and 710d of second conductive gate 706b. First source/drain impurity distribution 728 is substantially contained within first source/drain regions 730a and 730b. First source/drain regions 730a and 730b are laterally displaced on either side of a channel region 731 of first transistor region 708a. Channel boundaries 729a and 729b of first source/drain impurity regions 730a and 730b are laterally displaced from first and second sidewalls 710a and 710b of first conductive gate 706a by displacement $d_2$. Second source/drain impurity distribution 738 is substantially contained within second source/drain regions 740a and 740b of first transistor region 708a. Interior boundaries 741a and 741b are laterally displaced from first and second sidewalls 710a and 710b of first conductive gate 706a by a second displacement $d_3$. Second displacement $d_3$ is greater than first displacement $d_2$. Preferably, semiconductor substrate 702 comprises silicon having a resistivity of approximately 10 to 15Ωcm, the gate dielectric 704 is preferably comprised of a thermal oxide and has thickness of approximately 20 to 200 angstroms, and the first and second conductive gates 706a and 706b may, alternatively, comprise heavily doped polysilicon or a metal such as aluminum, copper, or tungsten. Suitable alloys of these metals may be used as conductive gate 706. In a presently preferred embodiment, first and second insulators 722a and 722b comprise oxide having a thickness of approximately 50 to 100 angstroms. Lightly doped impurity distributions 714a and 714b, in a presently preferred embodiment, comprise ions of arsenic, boron, or phosphorous and have a peak concentration of less than approximately $5 \times 10^{17}$ atoms/cm$^3$. First source/drain impurity distribution 728 preferably comprises arsenic, boron or phosphorous ions and has a peak concentration of approximately $1 \times 10^{17}$ to $5 \times 10^{20}$ atoms/cm$^3$. Second source/drain impurity distribution 738 also preferably comprises ions of arsenic, boron, or phosphorous. A peak concentration of second source/drain impurity distribution 738 is preferably greater than approximately $1 \times 10^{19}$ atoms/cm$^3$.

The first displacement $d_2$ is approximately 100 to 300 angstroms in a presently preferred embodiment while the second displacement $d_3$ is approximately 400 angstroms. A lateral dimension of first conductive gate 706a is ideally less than approximately 0.3 microns. In the preferred embodiment, a breakdown voltage necessary to conduct current from second source/drain region 730b with conductive gate 706a, first source/drain region 730a, and semiconductor substrate 702 grounded is greater than approximately 7 volts.

Turning now to FIG. 7A, a processing sequence will be described for forming integrated circuit 700. In FIG. 7A, first and second conductive gates 706a and 706b have been formed on gate dielectric 704. The formation of first and second conductive gate 706a and 706b is preferably accomplished with a chemical vapor deposition of polysilicon or a sputter deposition of metal as described previously with respect to the conductive gates of the other implementations disclosed herein. Subsequent to the formation of first and second conductive gate 706a and 706b, a patterned mask 711 is formed to protect the portion of semiconductor substrate 702 within first transistor regions 708a. Thereafter, lightly doped impurity distribution 714 is introduced into lightly doped impurity region 716 of semiconductor substrate 702 through the use of an ion implantation step 712. In the preferred embodiment, an implant energy suitable for the introduction of lightly doped impurity distribution 714 into semiconductor substrate 702 is less than approximately 20 keV while an implant dose is typically less than approximately $5 \times 10^{14}$ atoms/cm$^2$. As will be appreciated to those skilled in the art of semiconductor processing, implant steps such as implant 712 of FIG. 7A are suitably accomplished using phosphorous, arsenic, or boron depending upon the conductivity type of the subsequently formed transistor.

Turning now to FIG. 7B, gate insulators 722a and 722b are formed respectively in contact with sidewall 710 of first conductive gate 706a and second conductive gate 706b. In embodiments in which first and second conductive gate 706a and 706b comprise polysilicon, first gate insulator 722 is preferably formed through the thermal oxidation of the polysilicon within conductive gate 706. Alternatively, a chemical vapor deposition process may be used to deposit first gate insulator 722. A preferred thickness $d_1$, of gate insulator 722 is preferably between approximately 50 to 100 angstroms. Subsequent to the formation of gate insulators 722a and 722b, a masking step is performed to produce a patterned mask 724 over second transistor region 708b of semiconductor substrate 702. Thereafter, a first pair of spacer structures 726a and 726b are formed on exterior sidewalls of first gate insulator 722a. The formation of first spacer structures 726a and 726b is preferably accomplished with the use of a low pressure chemical vapor deposition process followed by an anisotropic etch with a minimal overetch all as are well known in the art and as previously discussed herein. In a preferred embodiment, first pair of spacer structures 726a and 726b comprise silicon nitride. The lateral dimension of first pair of spacer structures 726a and 726 is adjusted such that exterior sidewalls of first spacer structure 726a and 726b are displaced from respective sidewalls of conductive gate 706a by displacement $d_2$. In a presently preferred embodiment, displacement $d_2$ is approximately 100 to 300 angstroms. After the formation of the first pair of spacer structures 726, a first source/drain impurity distribution 728 is introduced into first source/drain regions 730a and 730b of semiconductor substrate 702 through the use of an ion implantation step 727. Due to the presence of first pair of spacer structures 726 and first gate insulators 722, respective channel boundaries 729 of first source/drain region 730 are laterally displaced from respective sidewalls 710 of first conductive gate 706 by approximately the displacement $d_2$. In the preferred embodiment, implantation 727 is performed using an implant dose in the range of approximately $2 \times 10^{12}$ to $5 \times 10^{15}$ atoms/cm$^2$. Subsequent to the formation of first source/drain regions 730 within semiconductor substrate 702, pattern masking layer 724 and first pair of spacer structures 726 are removed . Removal of patterned masking layer 724 is preferably accomplished with a conventional photoresist strip while the removal of first pair of spacer structures 726 may be accomplished with a wet etch solution selective to the dielectric used for first insulator 722a. Preferably, gate insulator 722 comprises oxide and first pair of spacer structures 726 comprise silicon nitride. In such an embodiment, the removal of spacer structures 726 can be suitably accomplished with an 85% phosphoric solution heated to approximately 120° C. Subsequent to the removal of spacer structure 726 and patterned masking layer 724, a second set of spacer structures 734 is formed upon exterior sidewalls of first and second gate insulators 722a and 722b. Second pair of spacer structures 734 are preferably formed with a chemical vapor deposition process using a TEOS or silane source followed by an anisotropic etch step. A lateral dimension of second pair of spacer structures 734 is adjusted such that exterior sidewalls of spacer structures 734 are laterally displaced from respective sidewalls of conductive gate 706 by displacement $d_3$. In the preferred embodiment, displacement $d_3$ is approximately 200 to 400 angstroms. Thereafter, second source/drain impurity distributions 738 is introduced into second source/drain regions 740a and 740b of semiconductor substrate 702 through the use of ion implantation step 736. This formation process results in a second source/drain impurity region having an interior boundary 741 laterally displaced from a respective sidewall of conductive gate 706 by the displacement $d_3$. As seen in FIG. 7c, implantation 736, in a preferred embodiment, simultaneously introduces a heavily doped source/drain impurity distribution into the detached type transistor formed in a first transistor region 708a and the more conventional LDD type transistor formed in transistor region 708b. This processing sequence therefore is compatible with existing processing sequences and requires the addition of just a single masking step to produce the detached drain type transistors formed in first transistor region 708a.

As will be appreciated to those skilled in the art of semiconductor fabrication, the present invention is useful for fabricating transistors exhibiting increased BVDSS at shorter channel lengths. Furthermore, it is to be understood that the form of the invention shown and described is to be taken as presently preferred embodiments. Various modifications and changes may be made to each and every processing step, as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A detached drain transistor, comprising:
   a semiconductor substrate;
   a source impurity distribution substantially contained within a source region of said semiconductor substrate;
   a drain impurity distribution, wherein said drain impurity distribution is substantially contained within a detached drain region of said semiconductor substrate;
   a gate dielectric formed on an upper surface of said semiconductor substrate; and
   a conductive gate formed on said gate dielectric laterally disposed over a channel region of said semiconductor substrate, wherein said channel region extends laterally between said source region of said semiconductor substrate and said detached drain region, and wherein a channel boundary of said detached drain region is laterally displaced from a first sidewall of said conductive gate by a drain displacement;
   wherein said source region of said semiconductor substrate comprises:
      a lightly doped source region extending to a first depth below said upper surface of said semiconductor substrate and further wherein said lightly doped source region is laterally displaced within said semiconductor substrate such that a channel boundary of said lightly doped source region is approximately coincident with a second sidewall of said conductive gate; and
      a heavily doped source region extending to a second depth below said upper surface of said semiconductor substrate wherein said second depth is greater than said first depth and wherein said heavily doped source region is laterally displaced within said semiconductor substrate such that a interior boundary of said heavily doped source region is displaced from said second sidewall of said conductive gate by a source displacement; and
   wherein said source impurity distribution comprises a first source impurity distribution substantially contained within said lightly doped source region and a second source impurity distribution substantially contained within said heavily doped source region, wherein a peak concentration of said second source impurity distribution is greater than a peak concentration of said first source impurity distribution.

2. The transistor of claim 1 wherein a peak concentration of said drain impurity distribution is approximately equal to a peak concentration of said second source impurity distribution and further wherein said drain displacement is approximately equal to said source displacement.

3. The transistor of claim 1 wherein said gate dielectric comprises a thermal oxide and wherein a thickness of said thermal oxide is approximately 20 to 200 angstroms.

4. The transistor of claim 1 wherein said conductive gate comprises polysilicon wherein a sheet resistivity of said polysilicon is less than approximately 500Ω/square.

5. The transistor of claim 1 wherein said conductive gate comprises a metal selected from the group consisting of aluminum, copper, tungsten, and alloys thereof.

6. The transistor of claim 1 wherein a lateral dimension of said conductive gate is less than approximately 0.3 microns.

7. The transistor of claim 6 wherein a lateral dimension of said conductive gate is in the range of approximately 0.2 to 0.3 microns.

8. The transistor of claim 6 wherein a lateral dimension of said conductive gate is in the range of approximately 0.1 to 0.2 microns.

9. The transistor of claim 6 wherein a lateral dimension of said conductive gate is in the range of approximately 0.05 to 0.1 microns.

10. The transistor of claim 6 wherein a drain breakdown voltage of said transistor is greater than approximately 7 V.

11. The transistor of claim 6 wherein said drain displacement is approximately 500 to 1500 angstroms.

12. The transistor of claim 1, wherein said semiconductor substrate comprises single crystal silicon, and wherein a resistivity of said silicon is approximately 10 to 15Ω-cm.

13. A transistor, comprising:
   a gate conductor formed on a gate dielectric over a channel region of a semiconductor substrate;
   a first spacer formed on a drain-side sidewall of said gate conductor, and a second spacer formed on a source-side sidewall of said gate conductor, wherein said first spacer and second spacer are formed from a single layer of spacer material;

a lightly-doped source region self-aligned to said source-side sidewall of said gate conductor, wherein the transistor has no corresponding lightly-doped drain region self-aligned to said drain-side sidewall of said gate conductor;

a heavily-doped source region self-aligned to said second spacer; and a drain region self-aligned to said first spacer.

14. The transistor as recited in claim 13, wherein said heavily-doped source region and said drain region are spaced approximately the same lateral distance from their respective gate conductor sidewalls.

15. The transistor as recited in claim 13, wherein said heavily-doped source region and said drain region have approximately the same peak impurity concentration.

16. The transistor as recited in claim 13, wherein said heavily-doped source region has a higher peak impurity concentration than said lightly-doped source region and wherein said heavily-doped source region extends further below the semiconductor substrate than said lightly-doped source region.

17. The transistor as recited in claim 13, wherein a lateral dimension of said gate conductor is less than approximately 0.3 microns.

18. The transistor as recited in claim 13, wherein a lateral dimension of said gate conductor is in the range of approximately 0.05 to 0.1 microns.

19. The transistor as recited in claim 13, wherein a drain breakdown voltage of the transistor is greater than approximately 7 V.

20. The transistor as recited in claim 13, wherein said drain region is self-aligned approximately 500 to 1500 angstroms from said drain-side sidewall of said gate conductor.

21. The transistor as recited in claim 13, wherein said single layer of spacer material is a conformal film, wherein a thickness of the conformal film in horizontal regions of the conformal film is within 20% of a thickness of the conformal film in vertical regions of the conformal film.

22. The transistor as recited in claim 13, wherein said single layer of spacer material is an oxide chemically vapor deposited from a TEOS or silane source at a pressure less than approximately 2 torrs.

* * * * *